US010804176B2

(12) United States Patent
Chen et al.

(10) Patent No.: US 10,804,176 B2
(45) Date of Patent: Oct. 13, 2020

(54) LOW STRESS MOISTURE RESISTANT STRUCTURE OF SEMICONDUCTOR DEVICE

(71) Applicants: WIN Semiconductors Corp., Tao Yuan (TW); THE CHEMOURS COMPANY FC, LLC, Wilmington, DE (US)

(72) Inventors: Ray Chen, Tao Yuan (TW); Xudong Chen, Tao Yuan (TW); Shih-Hui Huang, Tao Yuan (TW); Liang-Feng Shen, Tao Yuan (TW); Gin Tsai, Tao Yuan (TW); Walter Tony Wohlmuth, Tao Yuan (TW)

(73) Assignees: WIN Semiconductors Corp., Taoyuan (TW); The Chemours Company FC, LLC, Wilmington, DE (US)

( * ) Notice: Subject to any disclaimer, the term of this patent is extended or adjusted under 35 U.S.C. 154(b) by 0 days.

(21) Appl. No.: 16/281,711

(22) Filed: Feb. 21, 2019

(65) Prior Publication Data
US 2020/0273764 A1 Aug. 27, 2020

(51) Int. Cl.
*H01L 23/29* (2006.01)
*H01L 23/31* (2006.01)
(Continued)

(52) U.S. Cl.
CPC ............ *H01L 23/293* (2013.01); *C08F 14/18* (2013.01); *C09D 5/00* (2013.01); *C09D 127/22* (2013.01);
(Continued)

(58) Field of Classification Search
CPC ... H01L 23/293; H01L 24/04; H01L 23/3171; H01L 2224/0218; H01L 2224/0219;
(Continued)

(56) References Cited

U.S. PATENT DOCUMENTS

2005/0104220 A1* 5/2005 Tsuchiya ............... H01L 24/16
257/774
2006/0166459 A1* 7/2006 Ohashi ............ H01L 21/823481
438/425

(Continued)

*Primary Examiner* — Yasser A Abdelaziez
(74) *Attorney, Agent, or Firm* — Muncy, Geissler, Olds & Lowe, P.C.

(57) ABSTRACT

A low stress moisture resistant structure of semiconductor device comprises a low stress moisture resistant layer, wherein a semiconductor device is formed on a semiconductor wafer, the semiconductor device comprises at least one pad, the low stress moisture resistant layer is coated on the semiconductor device and the semiconductor wafer so that a pad top center surface of the pad is exposed. The low stress moisture resistant layer comprises a material comprising crosslinked fluoropolymer. A before-coated stress measured on the semiconductor wafer before the low stress moisture resistant layer is coated and an after-cured stress measured on the semiconductor wafer after the low stress moisture resistant layer is coated and cured define a stress difference, the stress difference is greater than or equal to $-5 \times 10^7$ dyne/cm$^2$ and less than or equal to $5 \times 10^7$ dyne/cm$^2$.

67 Claims, 12 Drawing Sheets

(51) Int. Cl.
  *H01L 23/00*    (2006.01)
  *C09D 5/00*    (2006.01)
  *C08F 14/18*    (2006.01)
  *C09D 127/22*    (2006.01)

(52) U.S. Cl.
  CPC .......... *H01L 23/3171* (2013.01); *H01L 24/04* (2013.01); *C08F 2810/20* (2013.01); *H01L 2224/0218* (2013.01); *H01L 2224/0219* (2013.01)

(58) Field of Classification Search
  CPC ............. H01L 2224/02; H01L 2224/05; H01L 2224/06; H01L 2224/07; H01L 2224/09; H01L 2224/08; C08F 14/18; C08F 2810/20; C09D 127/22; C09D 5/00
  See application file for complete search history.

(56) References Cited

U.S. PATENT DOCUMENTS

| | | | |
|---|---|---|---|
| 2010/0164112 A1* | 7/2010 | Hishida | H01L 24/05 257/761 |
| 2017/0148701 A1* | 5/2017 | Ikoshi | H01L 23/564 |
| 2017/0372996 A1* | 12/2017 | Matsumoto | H01L 23/3171 |

* cited by examiner

LOW STRESS MOISTURE RESISTANT STRUCTURE OF SEMICONDUCTOR DEVICE

FIELD OF THE INVENTION

The present invention is related to a moisture resistant structure of semiconductor device, especially a low stress moisture resistant structure of semiconductor device.

BACKGROUND OF THE INVENTION

Please refer to FIG. 3A, which shows a schematic top view of an embodiment of a moisture resistant layer for semiconductor device of conventional technology. And please also refer to FIG. 3B, which shows a cross-sectional schematic view taken along the section line I-I' of the embodiment of FIG. 3A. In FIGS. 3A and 3B, a semiconductor device 9 is formed on a semiconductor wafer 91. The semiconductor device 9 comprises a GaN high electron mobility transistor (HEMT) 92, a plurality of capacitors 93, a plurality of resistors 94, at least one pad 95, and a plurality of metal interconnects 97. The semiconductor wafer 91 has an outer surface 901. The high electron mobility transistor 92 has an outer surface. Each of the plurality of capacitors 93 has an outer surface. Each of the plurality of resistors 94 has an outer surface. Each of the plurality of pads 95 has an outer surface 902, wherein the outer surface 902 of each of the plurality of pads 95 includes a top surface 903. Each of the plurality of metal interconnects 97 has an outer surface 905. An outer surface 900 of the semiconductor device 9 includes the outer surface of the high electron mobility transistor 92, the outer surfaces of the plurality of capacitors 93, the outer surfaces of the plurality of resistors 94, the outer surfaces 902 of the plurality of pads 95, and the outer surfaces 905 of the plurality of metal interconnects 97. A moisture resistant layer 98 for semiconductor device 9 of conventional technology is made of Polyimide (PI), Benzocyclobutene (BCB) or Polybenzoxazole (PBO). The moisture resistant layer 98 is formed on the outer surface 900 of the semiconductor device 9 (including the outer surface of the high electron mobility transistor 92, the outer surfaces of the plurality of capacitors 93, the outer surfaces of the plurality of resistors 94, the outer surfaces 902 of the plurality of pads 95 (except the top surfaces 903 of the plurality of pads 95), and the outer surfaces 905 of the plurality of metal interconnects 97) and the outer surface 901 of the semiconductor wafer 91. The moisture resistant layer 98 does not cover the top surfaces 903 of the plurality of pads 95. Hence, the top surfaces 903 of the plurality of pads 95 are exposed.

In conventional technology, using Polyimide, Benzocyclobutene or Polybenzoxazole as the material of the moisture resistant layer 98 has some disadvantages. For example, using Polyimide as the material of the moisture resistant layer 98, the dielectric constant of Polyimide is about 3.0-3.3. It can result in higher loss of radio frequency (RF) performance due to higher dielectric constant. Furthermore, the Polyimide is cured at greater than or equal to 250° C. and less than or equal to 350° C. High curing temperature may result in the phenomenon of void defects on the bottom of the gate electrode. It affects the performance of the conventional GaN field effect transistor. Moreover, the water absorption rate of Polyimide is about 0.8%-1.7%. It is too high so that the moisture resistant ability of the moisture resistant layer 98 is poor.

When using Benzocyclobutene as the material of the moisture resistant layer 98, the residual stress is about 28 MPa. High residual stress may result the warpage of the semiconductor wafer 91. It also affects the performance of the semiconductor device 9. Furthermore, the water absorption rate of Benzocyclobutene is about 0.2%. The moisture resistant ability of the moisture resistant layer 98 is not good enough.

When using Polybenzoxazole as the material of the moisture resistant layer 98, the dielectric constant of Polyimide is about 2.9-3.2. It can result in higher loss of radio frequency (RF) performance due to higher dielectric constant. Furthermore, the water absorption rate of Polybenzoxazole is about 0.3%-0.5%. It is a bit too high so that the moisture resistant ability of the moisture resistant layer 98 is not good enough. Moreover, when using Polybenzoxazole as the material of the moisture resistant layer 98, the residual stress is about 32 MPa. High residual stress may result the warpage of the semiconductor wafer 91. A stress (in current case, it's a tensile stress) difference of the stress measured on the semiconductor wafer 91 before the moisture resistant layer 98 (Polybenzoxazole) is coated and the stress measured on the semiconductor wafer 91 after the moisture resistant layer 98 (Polybenzoxazole) is coated and cured is about $2.6 \times 10^8$ dyne/cm². The stress difference is related to the effect before the moisture resistant layer 98 (Polybenzoxazole) is coated and after the moisture resistant layer 98 (Polybenzoxazole) is coated and cured. The stress difference will also result the warpage of the semiconductor wafer 91. Please refer to FIG. 3C, which shows the warpage of the semiconductor wafer of an embodiment of a moisture resistant layer (Polybenzoxazole) for semiconductor device of conventional technology. The measured amount of the warpage of the semiconductor wafer 91 is 21.01 μm. It will affect the performance of the semiconductor device 9.

Accordingly, the present invention has developed a new design which may avoid the above mentioned drawbacks, may significantly enhance the performance of the devices and may take into account economic considerations. Therefore, the present invention then has been invented.

SUMMARY OF THE INVENTION

The main technical problem that the present invention is seeking to solve is to find a suitable material having a low stress (a low stress difference before coated and after coated and cured), low water absorption rate, low dielectric constant, and a low curing temperature so that the high loss of radio frequency (RF) performance may be improved, the phenomenon of void defects may be improved, the warpage of the semiconductor wafer may be reduced, the moisture resistant ability may be improved, and may significantly enhance the performance of the devices.

In order to solve the problems mentioned the above and to achieve the expected effect, the present invention provides a low stress moisture resistant structure of semiconductor device. The low stress moisture resistant structure comprises a low stress moisture resistant layer, wherein a semiconductor device is formed on a semiconductor wafer, wherein the semiconductor wafer has a wafer outer surface, wherein the semiconductor device comprises at least one pad, wherein the semiconductor device has a device outer surface, wherein the device outer surface includes a pad top outer surface of each of the at least one pad and an outside pad top device outer surface, wherein the pad top outer surface of each of the at least one pad includes a pad top center surface and a pad top peripheral surface, wherein the low stress moisture resistant layer is coated on the wafer outer surface, the outside pad top device outer surface, and the pad top peripheral surface of the pad top outer surface of each of the at least one pad so that the pad top center surface of the pad top outer surface of each of the at least one pad is exposed, wherein the low stress moisture resistant layer comprises a material comprising crosslinked fluoropolymer, wherein a before-coated stress measured on the semiconductor wafer before the low stress moisture resistant layer is coated and an after-cured stress measured on the semiconductor wafer after the low stress moisture resistant layer is coated and cured define a stress difference, and wherein the stress difference is greater than or equal to $-5 \times 10^7$ dyne/cm$^2$ and less than or equal to $5 \times 10^7$ dyne/cm$^2$.

The present invention further provides a low stress moisture resistant structure of semiconductor device. The low stress moisture resistant structure comprises a low stress moisture resistant layer, wherein a semiconductor device is formed on a semiconductor wafer, wherein the semiconductor wafer has a wafer outer surface, wherein the semiconductor device comprises at least one pad, wherein the semiconductor device has a device outer surface, wherein the device outer surface includes a pad top outer surface of each of the at least one pad and an outside pad top device outer surface, wherein the pad top outer surface of each of the at least one pad includes a pad top center surface, a pad top first intermediate surface, a pad top second intermediate surface, and a pad top peripheral surface, wherein the pad top first intermediate surface is located between the pad top center surface and the pad top second intermediate surface, wherein the pad top second intermediate surface is located between the pad top first intermediate surface and the pad top peripheral surface, wherein a base covering layer is coated on the wafer outer surface, the outside pad top device outer surface, the pad top second intermediate surface and the pad top peripheral surface of the pad top outer surface of each of the at least one pad, wherein the base covering layer includes a covering second intermediate part and an outside covering second intermediate part, wherein the covering second intermediate part covers the pad top second intermediate surface of the pad top outer surface of each of the at least one pad, wherein the covering second intermediate part of the base covering layer has a covering second intermediate part outer surface, wherein the outside covering second intermediate part of the base covering layer has an outside covering second intermediate part outer surface, wherein the low stress moisture resistant layer is coated on the outside covering second intermediate part outer surface of the outside covering second intermediate part of the base covering layer so that the covering second intermediate part outer surface of the covering second intermediate part of the base covering layer, the pad top first intermediate surface, and the pad top center surface of the pad top outer surface of each of the at least one pad are exposed, wherein the low stress moisture resistant layer comprises a material comprising crosslinked fluoropolymer, wherein a before-coated stress measured on the semiconductor wafer before the low stress moisture resistant layer is coated and an after-cured stress measured on the semiconductor wafer after the low stress moisture resistant layer is coated and cured define a stress difference, and wherein the stress difference is greater than or equal to $-5 \times 10^7$ dyne/cm$^2$, and less than or equal to $5 \times 10^7$ dyne/cm$^2$.

In one embodiment, the low stress moisture resistant layer is coated on the outside covering second intermediate part outer surface of the outside covering second intermediate part of the base covering layer and the covering second intermediate part outer surface of the covering second intermediate part of the base covering layer so that the pad top first intermediate surface and the pad top center surface of the pad top outer surface of each of the at least one pad are exposed.

In one embodiment, the low stress moisture resistant layer is coated on the outside covering second intermediate part outer surface of the outside covering second intermediate part of the base covering layer, the covering second intermediate part outer surface of the covering second intermediate part of the base covering layer, and the pad top first intermediate surface of the pad top outer surface of each of the at least one pad so that the pad top center surface of the pad top outer surface of each of the at least one pad is exposed.

In one embodiment, the base covering layer is made of at least one material selected from the group consisting of: silicon nitride, silicon oxide, aluminum nitride and aluminum oxide.

In one embodiment, a thickness of the base covering layer is greater than or equal to 0.01 μm, and the thickness of the base covering layer is less than or equal to 10 μm.

In one embodiment, the thickness of the base covering layer is greater than or equal to 0.01 μm, and the thickness of the base covering layer is less than or equal to 2 μm.

In one embodiment, the low stress moisture resistant layer is photodefined.

In one embodiment, the low stress moisture resistant layer is patterned by a photolithography process.

In one embodiment, the low stress moisture resistant layer is cured at greater than or equal to 170° C. and less than or equal to 250° C.

In one embodiment, the semiconductor wafer is made of Silicon or Diamond.

In one embodiment, the semiconductor wafer is a compound semiconductor wafer.

In one embodiment, the semiconductor wafer is made of one material selected from the group consisting of: GaAs, sapphire. InP, SiC, SOI and GaN.

In one embodiment, a thickness of the low stress moisture resistant layer is greater than or equal to 0.5 μm, and the thickness of the low stress moisture resistant layer is less than or equal to 30 μm.

In one embodiment, the thickness of the low stress moisture resistant layer is greater than or equal to 0.5 μm, and the thickness of the low stress moisture resistant layer is less than or equal to 10 μm.

In one embodiment, the semiconductor device comprises an epitaxial structure, wherein the device outer surface includes an epitaxial structure outer surface of the epitaxial structure.

In one embodiment, a dielectric constant of the low stress moisture resistant layer is greater than or equal to 2.0, and less than or equal to 2.9 when measured at 1 MHz.

In one embodiment, the fluoropolymer of the crosslinked fluoropolymer comprises crosslinkable fluoropolymer having crosslinkable groups.

In one embodiment, the fluoropolymer of the crosslinked fluoropolymer comprises crosslinkable fluoropolymer comprising repeat units arising from a first olefin having a crosslinkable group and repeat units arising from a fluoroolefin.

In a preferred embodiment the fluoropolymer of the crosslinked fluoropolymer comprises crosslinkable fluoropolymer comprising repeat units arising from a first olefin having a crosslinkable group, repeat units arising from a fluoroolefin, and repeat units arising from a second olefin.

In one embodiment, the repeat units arising from first olefin having a crosslinkable group is a repeat unit arising from ethylenically unsaturated silane of the formula SiR1R2R3R4, wherein R1 is an ethylenically unsaturated hydrocarbon radical. R2 and R3 are independently selected from substituted or unsubstituted aryl, substituted or unsubstituted aryl substituted hydrocarbon radical, substituted or unsubstituted linear or branched alkoxy radical, substituted or unsubstituted cyclic alkoxy radical, substituted or unsubstituted linear or branched alkyl radical, or substituted or unsubstituted cyclic alkyl radical, and R4 is substituted or unsubstituted linear or branched alkoxy radical, or substituted or unsubstituted cyclic alkoxy radical.

In one embodiment, the repeat units arising from first olefin having a crosslinkable group is a repeat unit arising from ethylenically unsaturated silane of the formula SiR1R2R3R4, wherein R1 is an ethylenically unsaturated hydrocarbon radical, R2 is aryl, aryl substituted hydrocarbon radical, branched C3-C6 alkoxy radical, or substituted or unsubstituted cyclic C5-C6 alkoxy radical, and R3 and R4 are independently selected from linear or branched C1-C6 alkoxy radical, or substituted or unsubstituted cyclic C5-C6 alkoxy radical.

In one embodiment, the repeat unit arising from first olefin having a crosslinkable group is a repeat unit arising from an ethylenically unsaturated epoxide.

In one embodiment, the repeat unit arising from first olefin having a crosslinkable group is a repeat unit arising from an ethylenically unsaturated epoxide selected from the group consisting of allyl glycidyl ether, glycidyl acrylate and glycidyl methacrylate.

In one embodiment, the fluoroolefin contains from 2 to 6 carbon atoms and at least 60 weight percent fluorine.

In one embodiment, the fluoroolefin contains from 2 to 6 carbon atoms and is perfluorinated.

In one embodiment, the amount of repeat units in the fluoropolymer arising from the fluoroolefin is about 40 to about 60 mole percent, wherein the amount of repeat units in the fluoropolymer arising from the second olefin is about 40 to about 60 mole percent, and wherein the amount of repeat units in the fluoropolymer arising from the first olefin having a crosslinkable group is about 0.2 to about 10 mole percent.

In one embodiment, the repeat units arising from a first olefin having a crosslinkable group is a repeat unit arising from an ethylenically unsaturated epoxide.

In one embodiment, the repeat units arising from a first olefin having a crosslinkable group is a repeat unit arising from an ethylenically unsaturated epoxide selected from the group consisting of allyl glycidyl ether, glycidyl acrylate and glycidyl methacrylate.

In one embodiment, the second olefin contains from 2 to 12 carbon atoms, and comprises the elements C, H and optionally at least one heteroatom selected from O, N and S and halogens F, Cl and Br.

In one embodiment, the second olefin is an alkyl vinyl ether wherein the alkyl group is a C1 to C6 straight chain alkyl radical or a C3 to C6 branched chain or cyclic alkyl radical, or aryl vinyl ether wherein the aryl group is unsubstituted or substituted.

In one embodiment, the fluoroolefin is tetrafluoroethylene and the amount of repeat units in the fluoropolymer arising from tetrafluoroethylene is about 40 to about 60 mole percent, the second olefin is ethyl vinyl ether and the amount of repeat units in the fluoropolymer arising from ethyl vinyl ether is about 40 to about 60 mole percent, the repeat unit arising from a first olefin having a crosslinkable group is a repeat unit arising from vinyltriisopropoxysilane, and the amount of repeat units in the fluoropolymer arising from the vinyltriisopropoxysilane is about 0.2 to about 10 mole percent.

In one embodiment, the fluoropolymer of the crosslinked fluoropolymer comprises crosslinkable fluoropolymer having repeat units comprising: (a) fluoroolefin selected from the group consisting of tetrafluoroethylene, chlorotrifluoroethylene, hexafluoropropylene, perfluoro(methyl vinyl ether), perfluoro(ethyl vinyl ether), and perfluoro(propyl vinyl ether); (b) alkyl vinyl ether wherein the alkyl group is a C1 to C6 straight chain alkyl radical or a C3 to C6 branched chain or cyclic alkyl radical, or aryl vinyl ether wherein the aryl group is unsubstituted or substituted; and (c) ethylenically unsaturated silane of the formula SiR1R2R3R4, wherein R1 is an ethylenically unsaturated hydrocarbon radical, R2 is aryl, aryl substituted hydrocarbon radical, branched C3-C6 alkoxy radical, or substituted or unsubstituted cyclic C5-C6 alkoxy radical, and R3 and R4 are independently selected from linear or branched C1-C6 alkoxy radical, or substituted or unsubstituted cyclic C5-C6 alkoxy radical.

For further understanding the characteristics and effects of the present invention, some preferred embodiments referred to drawings are in detail described as follows.

DETAILED DESCRIPTIONS OF PREFERRED EMBODIMENTS

Figure 1A:
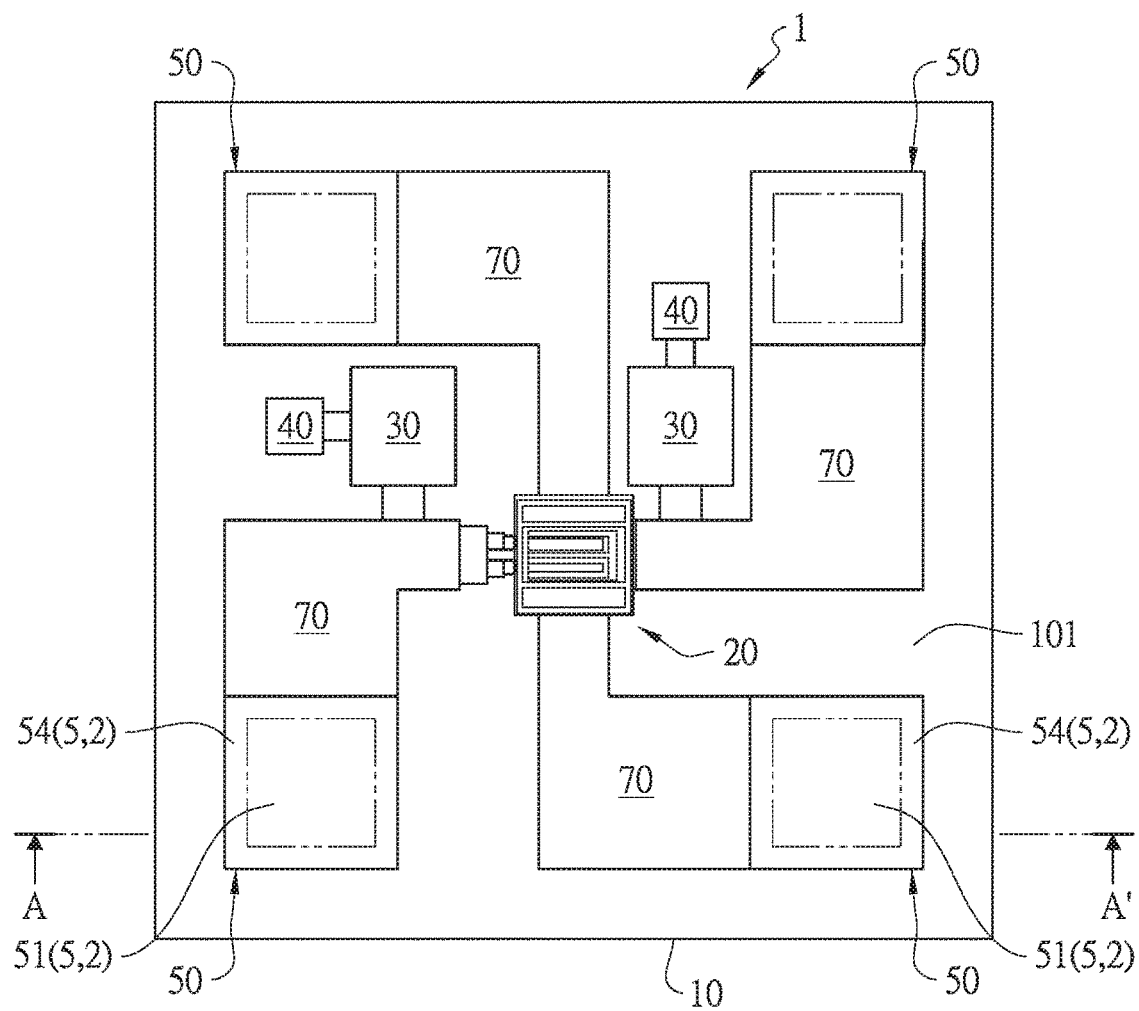
FIG. 1A is a schematic top view of an embodiment of the present invention before coating a low stress moisture resistant structure on semiconductor device.
Figure 1B:
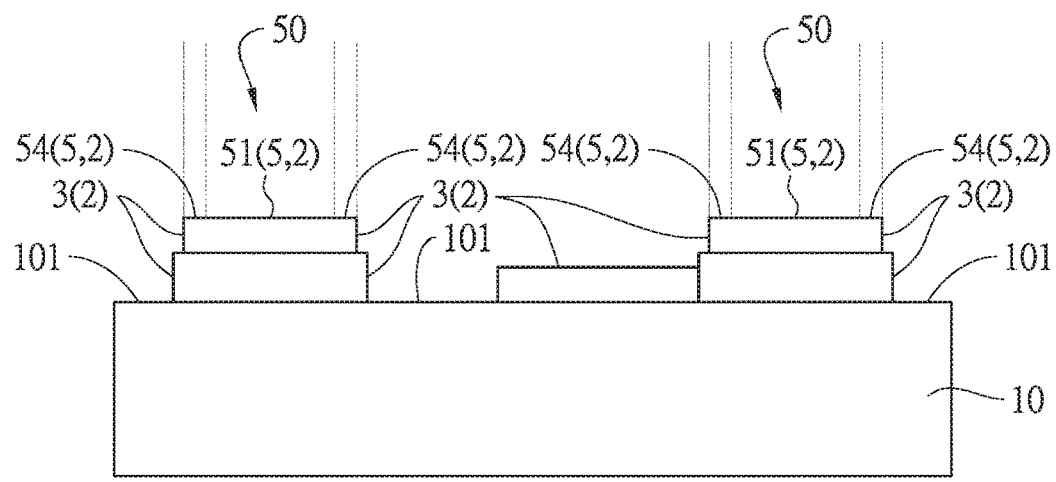
FIG. 1B is a cross-sectional schematic view taken along the section line A-A' of the embodiment of FIG. 1A.
Figure 1C:
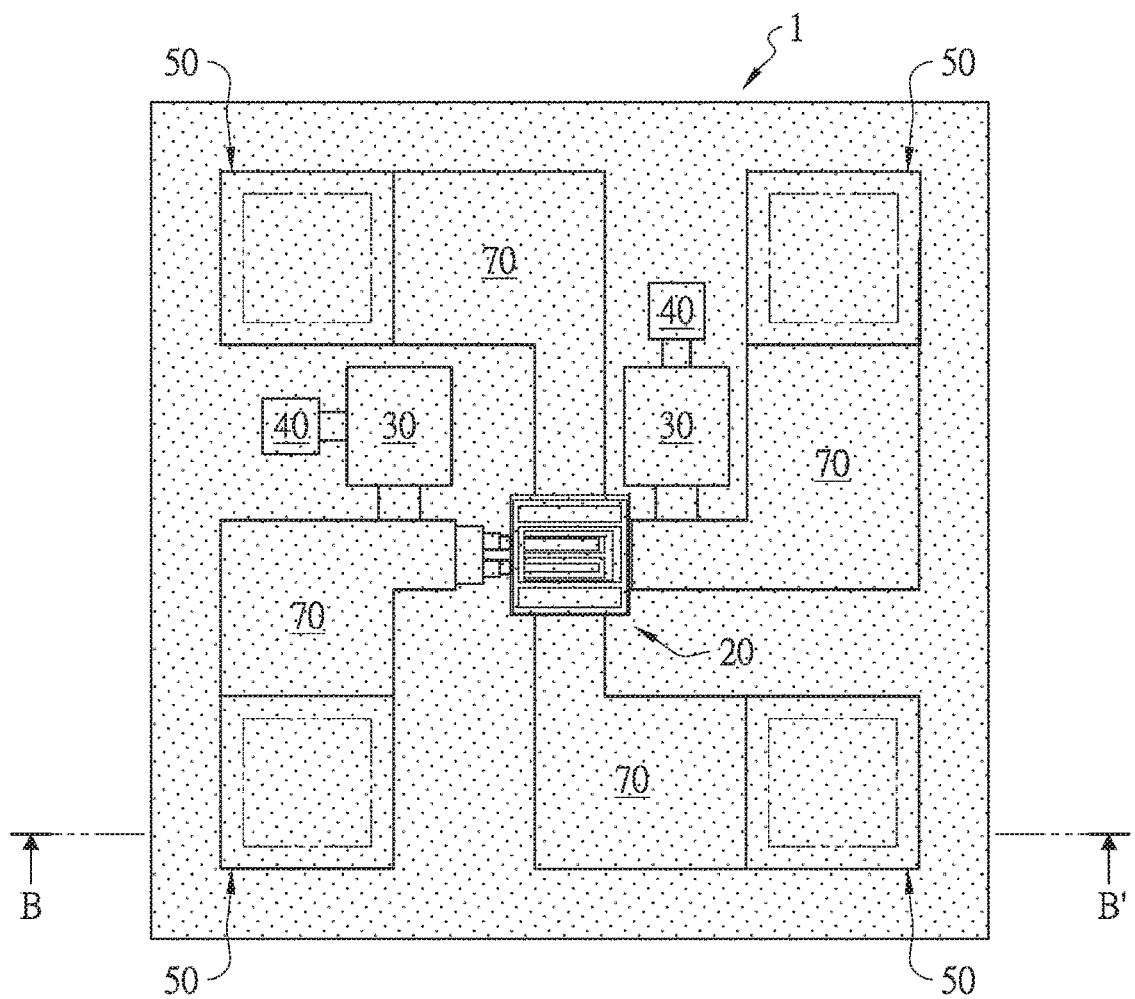
FIG. 1C is a schematic top view showing a step of a method for fabricating an embodiment of a low stress moisture resistant structure of semiconductor device of the present invention.
Figure 1D:
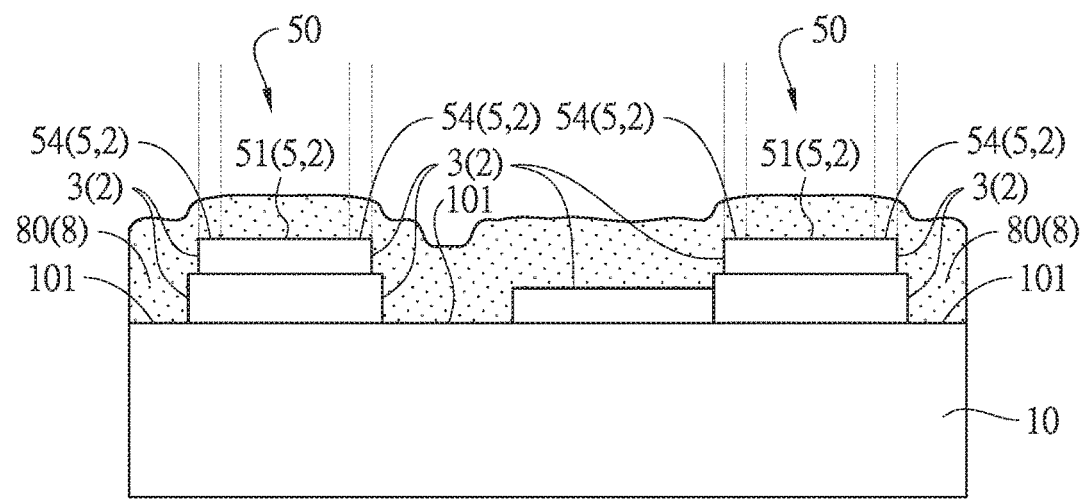
FIG. 1D is a cross-sectional schematic view taken along the section line B-B' of the embodiment of FIG. 1C.
Figure 1E:
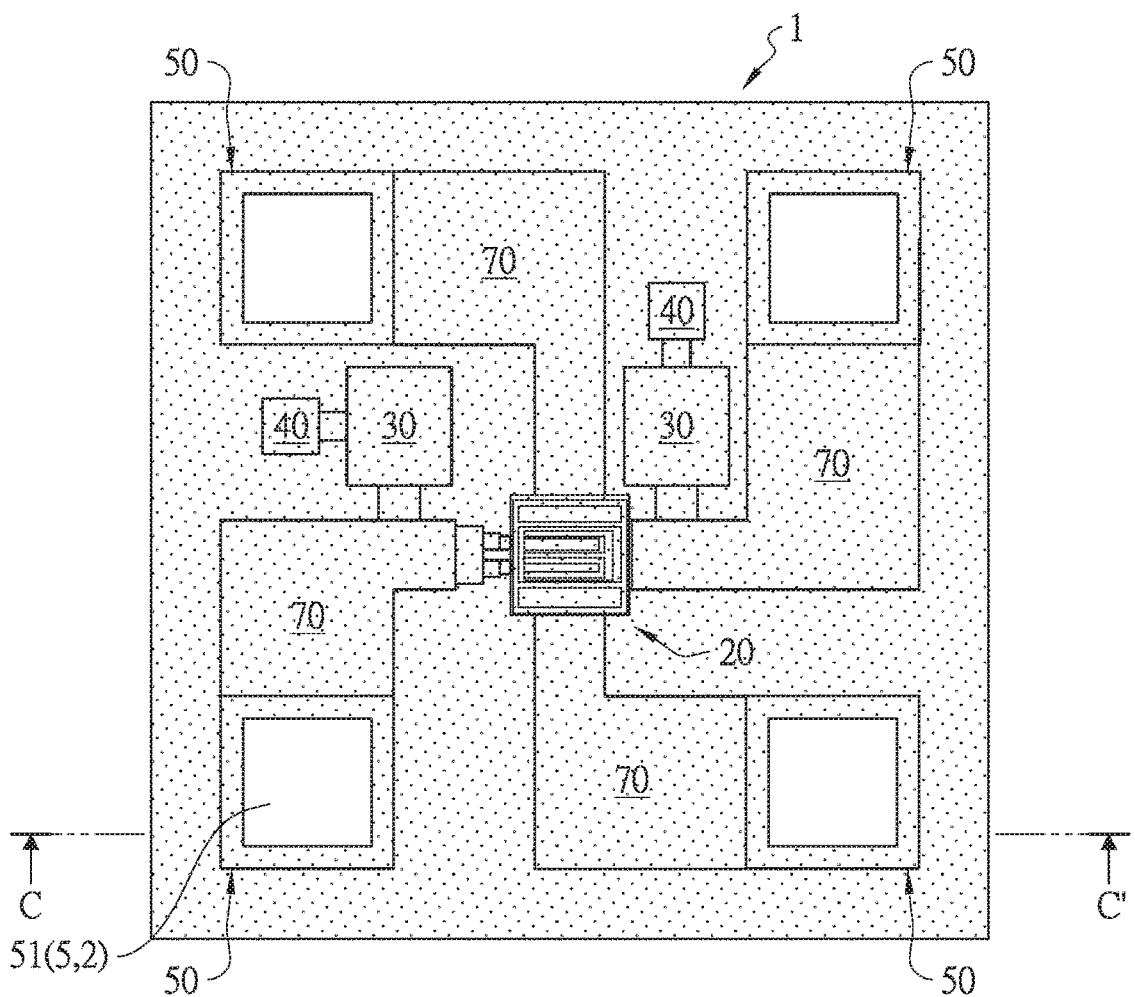
FIG. 1E is a schematic top view showing a step of a method for fabricating an embodiment of a low stress moisture resistant structure of semiconductor device of the present invention.
Figure 1F:
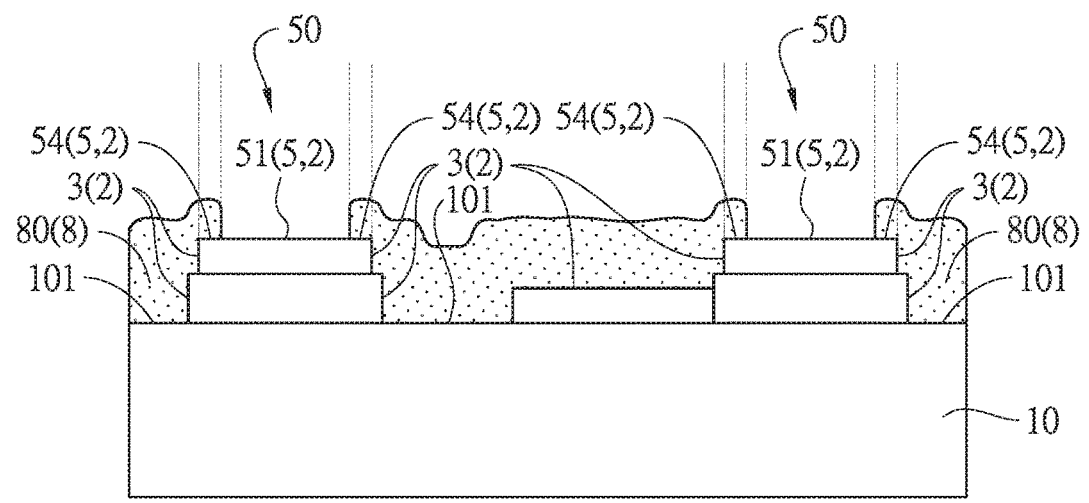
FIG. 1F is a cross-sectional schematic view taken along the section line C-C' of the embodiment of FIG. 1E.
Figure 1G:
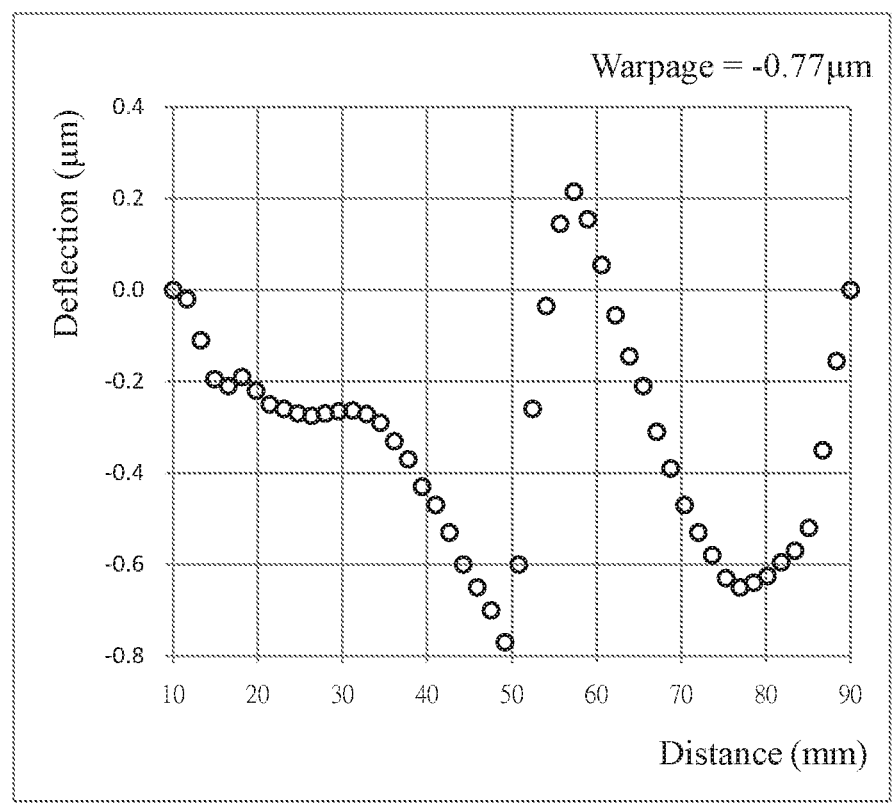
FIG. 1G is the warpage of the semiconductor wafer of an embodiment of a low stress moisture resistant structure of semiconductor device of the present invention.

Please refer to FIG. 1A, which shows a schematic top view of an embodiment of the present invention before coating a low stress moisture resistant structure on semiconductor device. Please also refer to FIG. 1B, which shows a cross-sectional schematic view taken along the section line A-A' of the embodiment of FIG. 1A. In current embodiment, a semiconductor wafer 10 has a wafer outer surface 101. A semiconductor device 1 is formed on the wafer outer surface 101 of the semiconductor wafer 10. In some embodiments, the semiconductor wafer 10 is made of Silicon or Diamond. In some other embodiments, the semiconductor wafer 10 is a compound semiconductor wafer which is made of one material selected from the group consisting of: GaAs, sapphire, InP, SiC, SOI and GaN. The semiconductor device 1 comprises a high electron mobility transistor 20, a plurality of capacitors 30, a plurality of resistors 40, a plurality of pads 50, and a plurality of metal interconnects 70. The semiconductor device 1 has a device outer surface 2 including an outer surface of the high electron mobility transistor 20, an outer surface of each of the capacitors 30, an outer surface of each of the resistors 40, an outer surface of each of the metal interconnects 70, and an outer surface of each of the pads 50. The outer surface of each of the pads 50 has a pad top outer surface 5 of each of the pads 50. The device outer surface 2 can be divided into the pad top outer surface 5 of each of the pads 50 and an outside pad top device outer surface 3. Hence, the outside pad top device outer surface 3 includes the outer surface of each of the pads 50 except the pad top outer surface 5 of each of the pads 50, the outer surface of the high electron mobility transistor 20, the outer surface of each of the capacitors 30, the outer surface of each of the resistors 40, and the outer surface of each of the metal interconnects 70. The pad top outer surface 5 of each of the pads 50 is divided into a pad top center surface 51 and a pad top peripheral surface 54. The present invention provides a method for fabricating an embodiment shown in FIGS. 1G and 1H. The fabricating method comprises following steps of: Step A1, Step A2, and Step A3. The Step A1: (Please refer to FIG. 1C, which shows a schematic top view showing a step of a method for fabricating an embodiment of a low stress moisture resistant structure of semiconductor device of the present invention; and please also refer to FIG. 1D, which shows a cross-sectional schematic view taken along the section line B-B' of the embodiment of FIG. 1C) coating a low stress moisture resistant structure 8 on the wafer outer surface 101 of the semiconductor wafer 10 and device outer surface 2 of the semiconductor device 1, wherein the low stress moisture resistant structure 8 comprises a low stress moisture resistant layer 80. The low stress moisture resistant layer 80 comprises a material comprising crosslinked fluoropolymer. The low stress moisture resistant layer 80 is photodefined. In some preferable embodiments, a thickness of the low stress moisture resistant layer 80 is greater than or equal to 0.5 μm, and the thickness of the low stress moisture resistant layer 80 is less than or equal to 30±m. In some other preferable embodiments, the thickness of the low stress moisture resistant layer 80 is greater than or equal to 0.5 μm, and the thickness of the low stress moisture resistant layer 80 is less than or equal to 10 μm. Before the low stress moisture resistant layer 80 of the low stress moisture resistant structure 8 is coated, a before-coated stress is measured on the semiconductor wafer 10. The Step A2: curing the low stress moisture resistant layer 80 of the low stress moisture resistant structure 8. The low stress moisture resistant layer 80 can be cured at greater than or equal to 170° C. and less than or equal to 250° C. The Step A3: (Please refer to FIG. 1E, which shows a schematic top view of an embodiment of a low stress moisture resistant structure of semiconductor device of the present invention: and please also refer to FIG. 1F, which shows a cross-sectional schematic view taken along the section line C-C' of the embodiment of FIG. 1E) patterning the low stress moisture resistant layer 80 of the low stress moisture resistant structure 8 by a photolithography process. After the photolithography process, the low stress moisture resistant layer 80 of the low stress moisture resistant structure 8 is patterned such that the pad top center surface 51 of the pad top outer surface 5 of each of the pads 50 is exposed. That is that the wafer outer surface 101 of the semiconductor wafer 10, the outside pad top device outer surface 3 (including the outer surface of each of the pads 50 except the pad top outer surface 5 of each of the pads 50, the outer surface of the high electron mobility transistor 20, the outer surface of each of the capacitors 30, the outer surface of each of the resistors 40, and the outer surface of each of the metal interconnects 70), and the pad top peripheral surface 54 of the pad top outer surface 5 of each of the pads 50 are covered by the low stress moisture resistant layer 80 of the low stress moisture resistant structure 8. After the low stress moisture resistant layer 80 of the low stress moisture resistant structure 8 is coated and cured, an after-cured stress is measured on the semiconductor wafer 10. A stress difference is the difference of the before-coated stress and the after-cured stress. In some preferable embodiments, the stress difference is greater than or equal to $-5 \times 10^7$ dyne/cm$^2$ and less than or equal to $5 \times 10^7$ dyne/cm$^2$. The residual stress of the low stress moisture resistant layer 80 of the low stress moisture resistant structure 8 is about 3.53 MPa. Please refer to FIG. 1G, which shows the warpage of the semiconductor wafer of an embodiment of a low stress moisture resistant structure of semiconductor device of the present invention. The measured amount of the warpage of the semiconductor wafer is −0.77 μm. The measured amount of the warpage of the semiconductor wafer of the present invention is much smaller than the measured amount of the warpage of the semiconductor wafer of the conventional technology. Hence, the warpage of the semiconductor wafer may be reduced. Furthermore, the water absorption rate of the low stress moisture resistant layer 80 of the low stress moisture resistant structure 8 is 0.11%, hence, the moisture resistant ability may be improved. Moreover, the dielectric constant of the low stress moisture resistant layer 80 is greater than or equal to 2.0, and less than or equal to 2.9 when measured at 1 MHz, therefore, the high loss of radio frequency (RF) performance may be improved. Furthermore, the curing temperature of the low stress moisture resistant layer 80 of the low stress moisture resistant structure 8 is greater than or equal to 170° C. and less than or equal to 250° C. It may reduce the phenomenon of void defects. Therefore, the low stress moisture resistant layer 80 of the low stress moisture resistant structure 8 of the present invention may significantly enhance the performance of the devices.

In some preferable embodiments, the stress difference is greater than or equal to $-8\times10^7$ dyne/cm$^2$ and less than or equal to $8\times10^7$ dyne/cm$^2$. In some other preferable embodiments, the stress difference is greater than or equal to $-2\times10^7$ dyne/cm$^2$ and less than or equal to $2\times10^7$ dyne/cm$^2$. In some preferable embodiments, the stress difference is greater than or equal to $-8\times10^6$ dyne/cm$^2$ and less than or equal to $8\times10^6$ dyne/cm$^2$. In some other preferable embodiments, the stress difference is greater than or equal to $-5\times10^6$ dyne/cm$^2$ and less than or equal to $5\times10^6$ dyne/cm$^2$. In some preferable embodiments, the stress difference is greater than or equal to $-3\times10^6$ dyne/cm$^2$ and less than or equal to $3\times10^6$ dyne/cm$^2$. In some other preferable embodiments, the stress difference is greater than or equal to $-1\times10^6$ dyne/cm$^2$ and less than or equal to $1\times10^6$ dyne/cm$^2$.

In some embodiments, the thickness of the low stress moisture resistant layer 80 is greater than or equal to 0.5 μm, and less than or equal to 27 μm. In some other embodiments, the thickness of the low stress moisture resistant layer 80 is greater than or equal to 0.5 μm, and less than or equal to 23 μm. In some embodiments, the thickness of the low stress moisture resistant layer 80 is greater than or equal to 0.5 μm, and less than or equal to 20 μm. In some other embodiments, the thickness of the low stress moisture resistant layer 80 is greater than or equal to 0.5 μm, and less than or equal to 17 μm. In some embodiments, the thickness of the low stress moisture resistant layer 80 is greater than or equal to 0.5 μm, and less than or equal to 13 μm. In some other embodiments, the thickness of the low stress moisture resistant layer 80 is greater than or equal to 0.5 μm, and less than or equal to 7 μm. In some embodiments, the thickness of the low stress moisture resistant layer 80 is greater than or equal to 0.5 μm, and less than or equal to 5 μm. In some other embodiments, the thickness of the low stress moisture resistant layer 80 is greater than or equal to 0.5 μm, and less than or equal to 3 μm.

In some embodiments, the dielectric constant of the low stress moisture resistant layer 80 is greater than or equal to 2.0, and less than or equal to 2.8 when measured at 1 MHz. In some other embodiments, the dielectric constant of the low stress moisture resistant layer 80 is greater than or equal to 2.0, and less than or equal to 2.7 when measured at 1 MHz. In some embodiments, the dielectric constant of the low stress moisture resistant layer 80 is greater than or equal to 2.0, and less than or equal to 2.6 when measured at 1 MHz. In some other embodiments, the dielectric constant of the low stress moisture resistant layer 80 is greater than or equal to 2.0, and less than or equal to 2.5 when measured at 1 MHz.

Figure 2A:
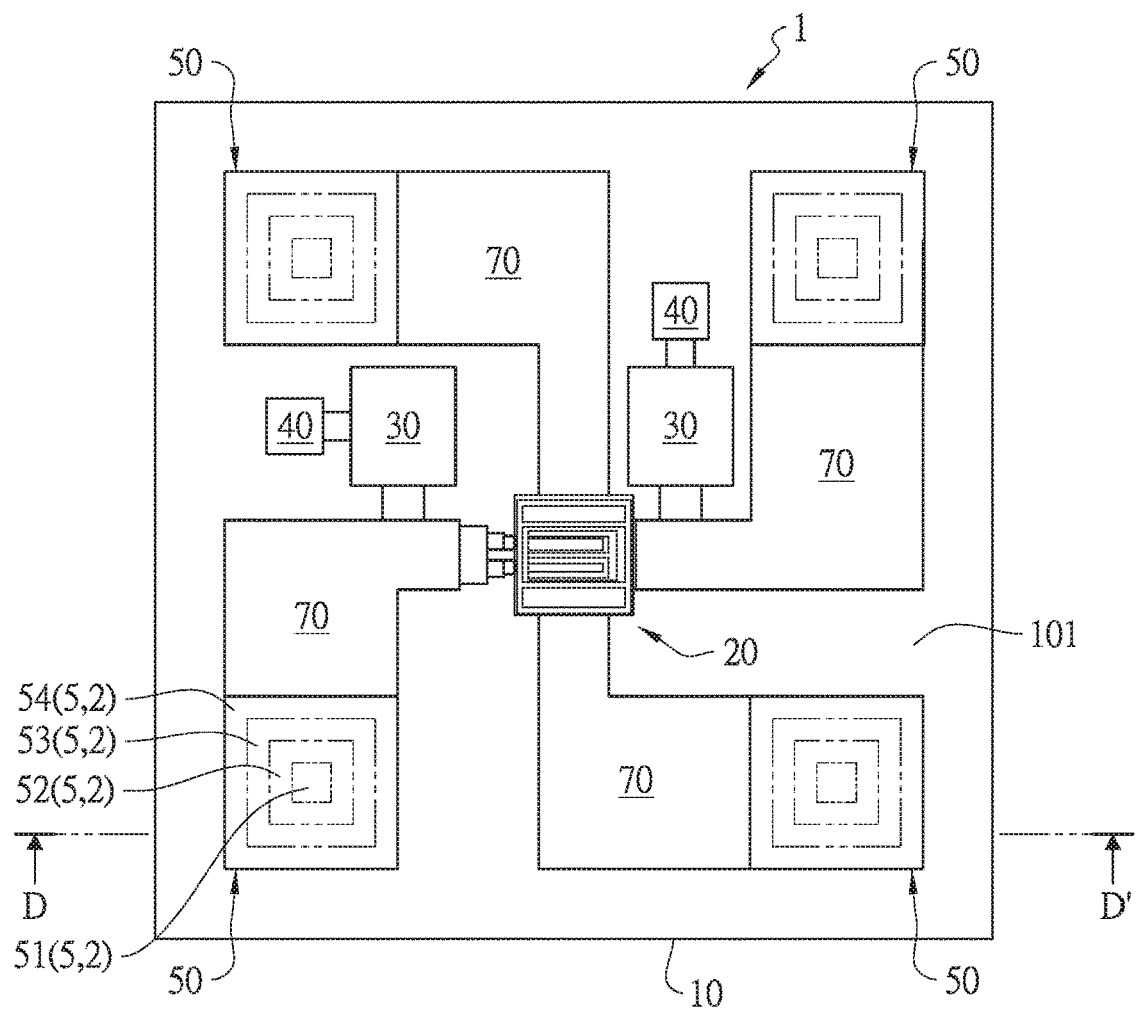
FIG. 2A is a schematic top view of an embodiment of the present invention before coating a low stress moisture resistant structure on semiconductor device.
Figure 2B:
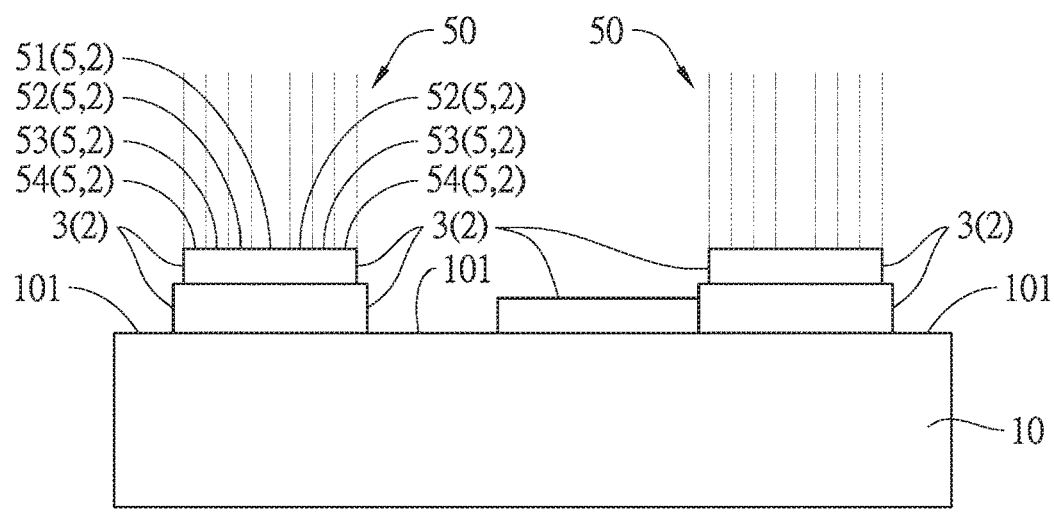
FIG. 2B is a cross-sectional schematic view taken along the section line D-D' of the embodiment of FIG. 2A.
Figure 2C:
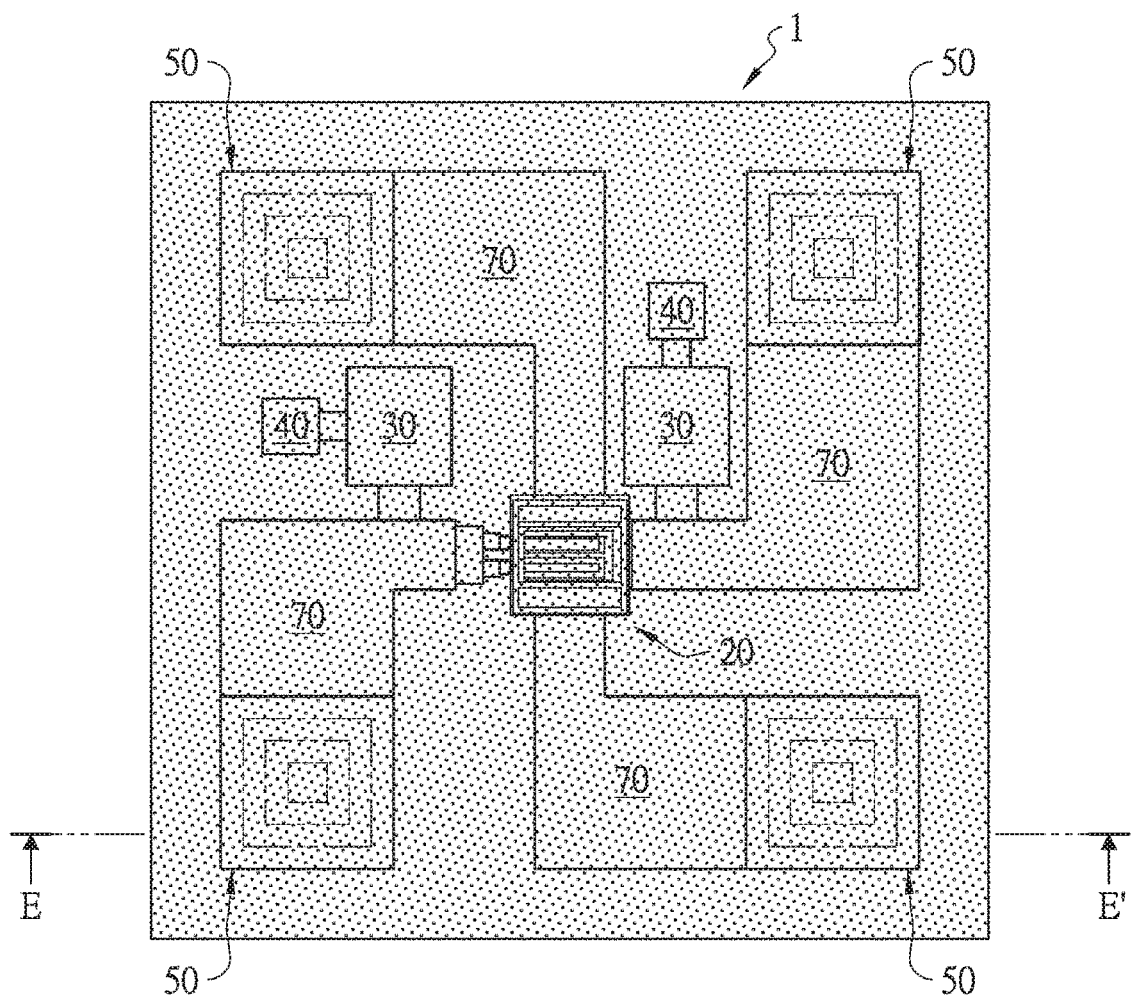
FIG. 2C is a schematic top view showing a step of a method for fabricating an embodiment of a low stress moisture resistant structure of semiconductor device of the present invention.
Figure 2D:
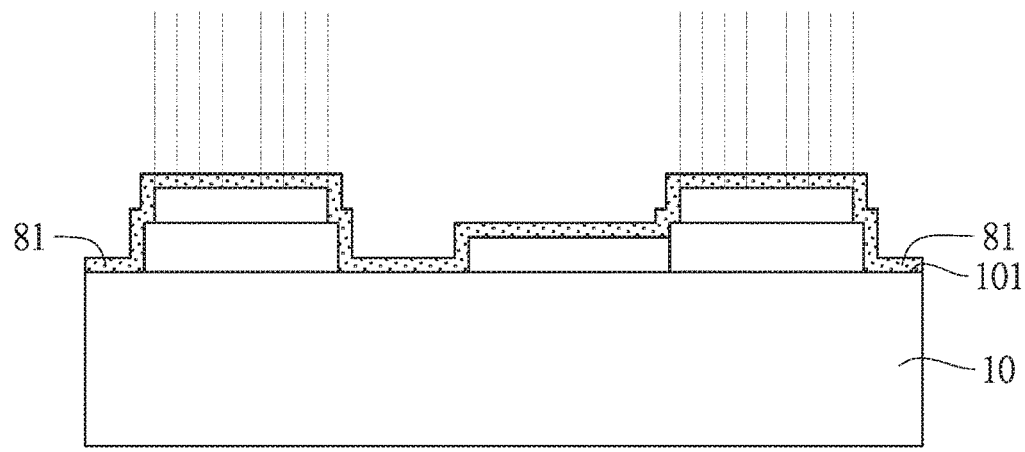
FIG. 2D is a cross-sectional schematic view taken along the section line E-E' of the embodiment of FIG. 2C.
Figure 2E:
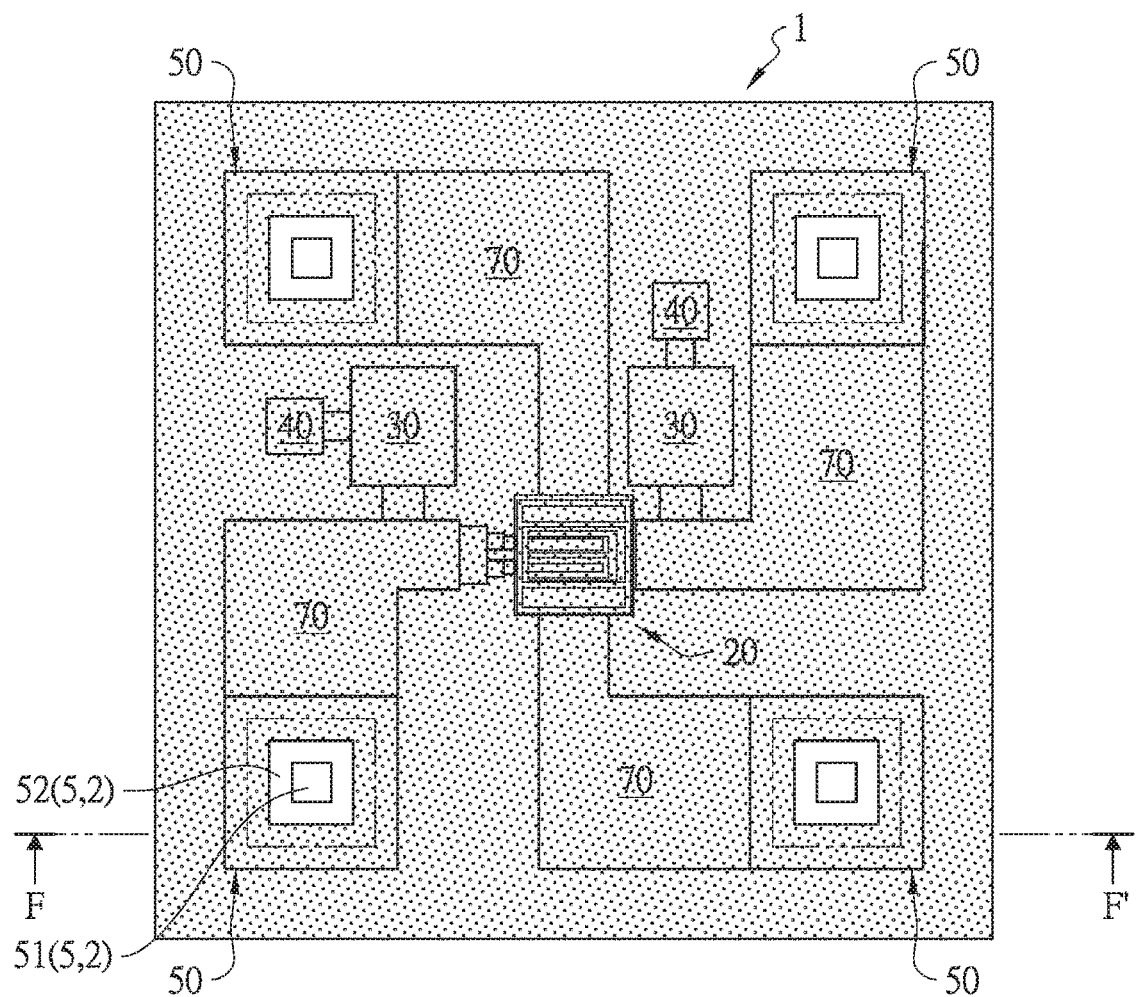
FIG. 2E is a schematic top view showing a step of a method for fabricating an embodiment of a low stress moisture resistant structure of semiconductor device of the present invention.
Figure 2F:
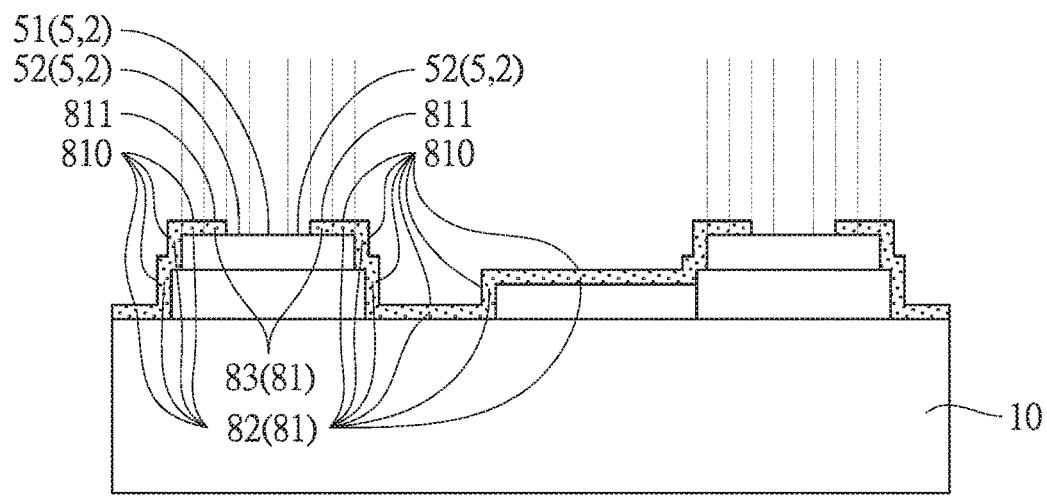
FIG. 2F is a cross-sectional schematic view taken along the section line F-F' of the embodiment of FIG. 2E.
Figure 2G:
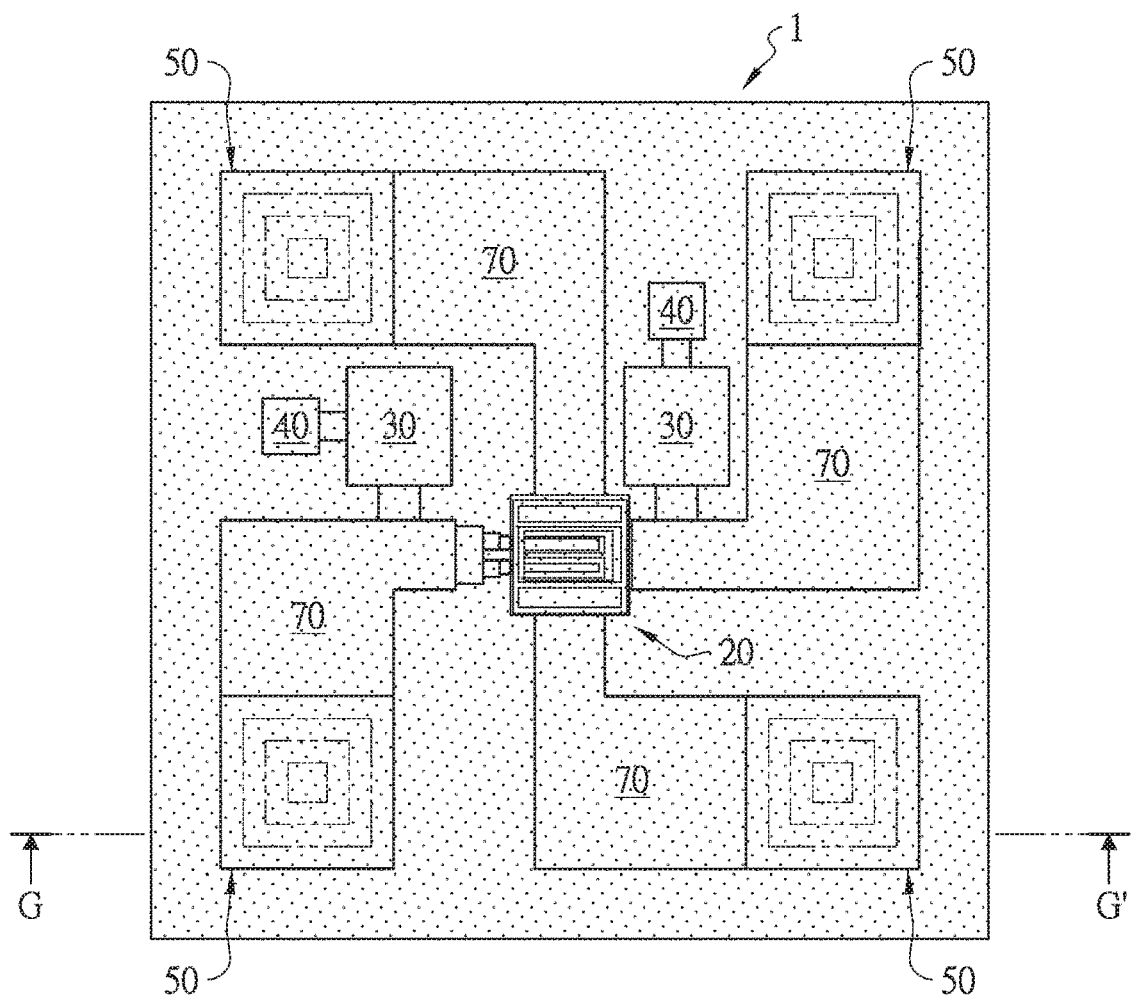
FIG. 2G is a schematic top view showing a step of a method for fabricating an embodiment of a low stress moisture resistant structure of semiconductor device of the present invention.
Figure 2H:
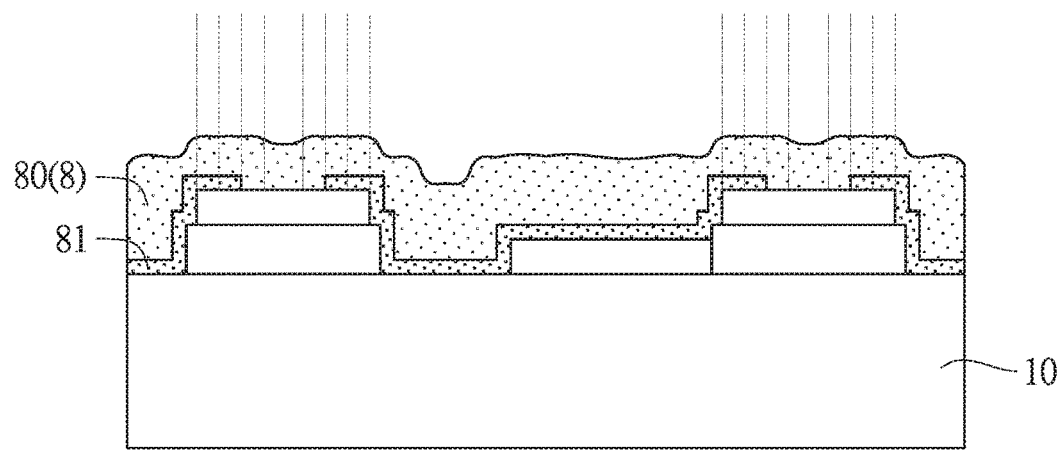
FIG. 2H is a cross-sectional schematic view taken along the section line G-G' of the embodiment of FIG. 2G.
Figure 2I:
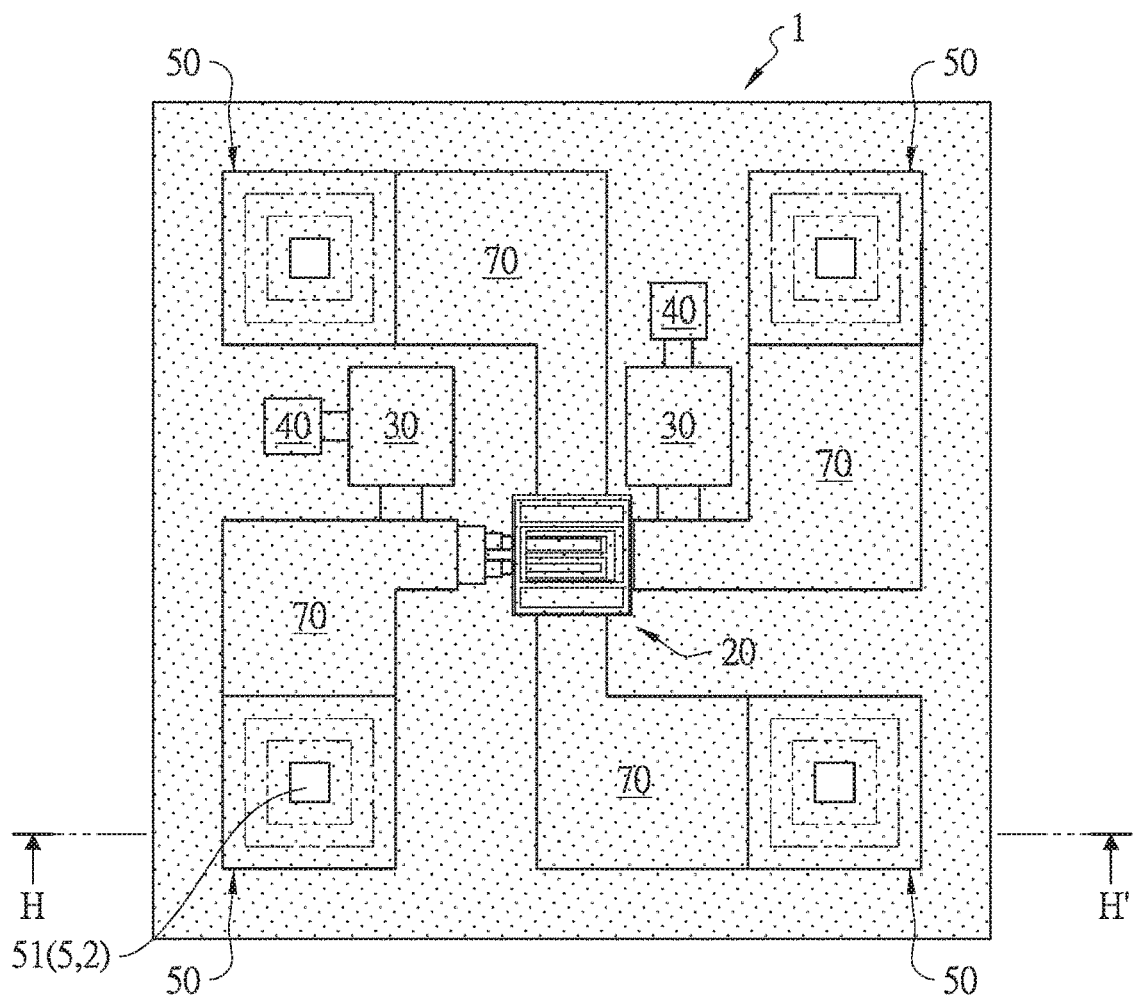
FIG. 2I is a schematic top view of an embodiment of a low stress moisture resistant structure of semiconductor device of the present invention.
Figure 2J:
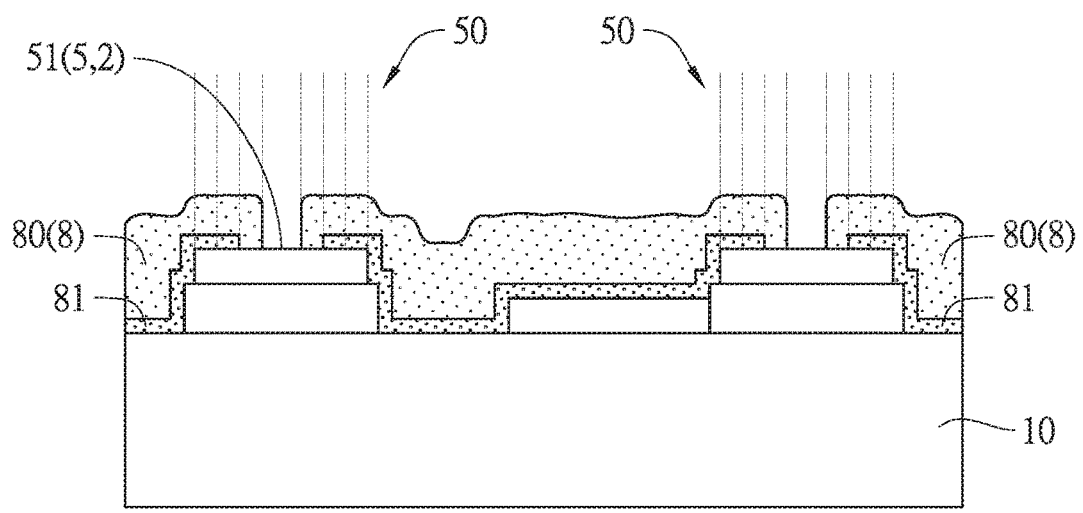
FIG. 2J is a cross-sectional schematic view taken along the section line H-H' of the embodiment of FIG. 2I.

Please refer to FIG. 2A, which shows a schematic top view of an embodiment of the present invention before coating a low stress moisture resistant structure on semiconductor device. Please also refer to FIG. 2B, which shows a cross-sectional schematic view taken along the section line D-D' of the embodiment of FIG. 2A. The main structure of the embodiment of FIG. 2A is basically the same as the structure of the embodiment of FIG. 1A, except that the pad top outer surface 5 of each of the pads 50 is divided into a pad top center surface 51, a pad top first intermediate surface 52, a pad top second intermediate surface 53, and a pad top peripheral surface 54, wherein the pad top first intermediate surface 52 is located between the pad top center surface 51 and the pad top second intermediate surface 53, wherein the pad top second intermediate surface 53 is located between the pad top first intermediate surface 52 and the pad top peripheral surface 54. In some embodiments, the semiconductor wafer 10 is made of Silicon or Diamond. In some other embodiments, the semiconductor wafer 10 is a compound semiconductor wafer which is made of one material selected from the group consisting of: GaAs, sapphire, InP, SiC, SOI and GaN. The present invention further provides a method for fabricating an embodiment shown in FIGS. 2I and 2J. The fabricating method comprises following steps of: Step B1, Step B2, Step B3, Step B4, and Step B5. The Step B1: (Please refer to FIG. 2C, which shows a schematic top view showing a step of a method for fabricating an embodiment of a low stress moisture resistant structure of semiconductor device of the present invention. Please also refer to FIG. 2D, which shows a cross-sectional schematic view taken along the section line E-E' of the embodiment of FIG. 2C) coating a base covering layer 81 on the wafer outer surface 101 of the semiconductor wafer 10 and device outer surface 2 of the semiconductor device 1. The base covering layer 81 is made of at least one material selected from the group consisting of: silicon nitride, silicon oxide, aluminum nitride and aluminum oxide. In some preferable embodiments, a thickness of the base covering layer 81 is greater than or equal to 0.01 μm, and less than or equal to 10 μm. In some other preferable embodiments, a thickness of the base covering layer 81 is greater than or equal to 0.01 μm, and less than or equal to 2 μm. The Step B2: (Please refer to FIG. 2E, which shows a schematic top view showing a step of a method for fabricating an embodiment of a low stress moisture resistant structure of semiconductor device of the present invention. Please also refer to FIG. 2F, which shows a cross-sectional schematic view taken along the section line F-F' of the embodiment of FIG. 2E) patterning the base covering layer 81 so that the pad top center surface 51 of the pad top outer surface 5 of each of the pads 50 and the pad top first intermediate surface 52 of the pad top outer surface 5 of each of the pads 50 are exposed. That is that the wafer outer surface 101, the outside pad top device outer surface 3 (including the outer surface of each of the pads 50 except the pad top outer surface 5 of each of the pads 50, the outer surface of the high electron mobility transistor 20, the outer surface of each of the capacitors 30, the outer surface of each of the resistors 40, and the outer surface of each of the metal interconnects 70), the pad top second intermediate surface 53 of the pad top outer surface 5 of each of the pads 50, and the pad top peripheral surface 54 of the pad top outer surface 5 of each of the pads 50 are covered by the base covering layer 81. The base covering layer 81 includes a covering second intermediate part 83 and an outside covering second intermediate part 82. The covering second intermediate part 83 of the base covering layer 81 covers the pad top second intermediate surface 53 of the pad top outer surface 5 of each of the pads 50. The covering second intermediate part 83 of the base covering layer 81 has a covering second intermediate part outer surface 811. The outside covering second intermediate part 82 of the base covering layer 81 covers the wafer outer surface 101, the outside pad top device outer surface 3 (including the outer surface of each of the pads 50 except the pad top outer surface 5 of each of the pads 50, the outer surface of the high electron mobility transistor 20, the outer surface of each of the capacitors 30, the outer surface of each of the resistors 40, and the outer surface of each of the metal interconnects 70), and the pad top peripheral surface 54 of the pad top outer surface 5 of each of the pads 50. The outside covering second intermediate part 82 of the base covering layer 81 has an outside covering second intermediate part outer surface 810. The Step B3: (Please refer to FIG. 2G, which shows a schematic top view showing a step of a method for fabricating an embodiment of a low stress moisture resistant structure of semiconductor device of the present invention. Please also refer to FIG. 2H, which shows a cross-sectional schematic view taken along the section line G-G' of the embodiment of FIG. 2G) coating a low stress moisture resistant structure 8 on the covering second intermediate part outer surface 811, the outside covering second intermediate part outer surface 810, the pad top center surface 51 of the pad top outer surface 5 of each of the pads 50, and the pad top first intermediate surface 52 of the pad top outer surface 5 of each of the pads 50, wherein the low stress moisture resistant structure 8 comprises a low stress moisture resistant layer 80. The low stress moisture resistant layer 80 comprises a material comprising cross-linked fluoropolymer. The low stress moisture resistant layer 80 is photodefined. A dielectric constant of the low stress moisture resistant layer 80 is greater than or equal to 2.0, and less than or equal to 2.9 when measured at 1 MHz. In some preferable embodiments, a thickness of the low stress moisture resistant layer 80 is greater than or equal to 0.5 µm, and the thickness of the low stress moisture resistant layer 80 is less than or equal to 30 µm. In some other preferable embodiments, the thickness of the low stress moisture resistant layer 80 is greater than or equal to 0.5 µm, and the thickness of the low stress moisture resistant layer 80 is less than or equal to 10 µm. Before the low stress moisture resistant layer 80 of the low stress moisture resistant structure 8 is coated, a before-coated stress is measured on the semiconductor wafer 10. The Step B4: curing the low stress moisture resistant layer 80 of the low stress moisture resistant structure 8. The low stress moisture resistant layer 80 can be cured at greater than or equal to 170° C. and less than or equal to 250° C. The Step B5: (Please refer to FIG. 2I, which shows a schematic top view of an embodiment of a low stress moisture resistant structure of semiconductor device of the present invention. Please also refer to FIG. 2J, which shows a cross-sectional schematic view taken along the section line H-H' of the embodiment of FIG. 2I) patterning the low stress moisture resistant layer 80 of the low stress moisture resistant structure 8 by a photolithography process. After the photolithography process, the low stress moisture resistant layer 80 of the low stress moisture resistant structure 8 is patterned such that the pad top center surface 51 of the pad top outer surface 5 of each of the pads 50 is exposed. That is that the outside covering second intermediate part outer surface 810 of the outside covering second intermediate part 82 of the base covering layer 81, the covering second intermediate part outer surface 811 of the covering second intermediate part 83 of the base covering layer 81, and the pad top first intermediate surface 52 of the pad top outer surface 5 of each of the pads 50 are covered by the low stress moisture resistant layer 80 of the low stress moisture resistant structure 8. After the low stress moisture resistant layer 80 of the low stress moisture resistant structure 8 is coated and cured, an after-cured stress is measured on the semiconductor wafer 10. A stress difference is the difference of the before-coated stress and the after-cured stress. In some preferable embodiments, the stress difference is greater than or equal to $-5 \times 10^7$ dyne/cm$^2$ and less than or equal to $5 \times 10^7$ dyne/cm$^2$.

In some preferable embodiments, the stress difference is greater than or equal to $-8 \times 10^7$ dyne/cm$^2$ and less than or equal to $8 \times 10^7$ dyne/cm$^2$. In some other preferable embodiments, the stress difference is greater than or equal to $-2 \times 10^7$ dyne/cm$^2$ and less than or equal to $2 \times 10^7$ dyne/cm$^2$. In some preferable embodiments, the stress difference is greater than or equal to $-8 \times 10^6$ dyne/cm$^2$ and less than or equal to $8 \times 10^6$ dyne/cm$^2$. In some other preferable embodiments, the stress difference is greater than or equal to $-5 \times 10^6$ dyne/cm$^2$ and less than or equal to $5 \times 10^6$ dyne/cm$^2$. In some preferable embodiments, the stress difference is greater than or equal to $-3 \times 10^6$ dyne/cm$^2$ and less than or equal to $3 \times 10^6$ dyne/cm$^2$. In some other preferable embodiments, the stress difference is greater than or equal to $-1 \times 10^6$ dyne/cm$^2$ and less than or equal to $1 \times 10^6$ dyne/cm$^2$.

In some embodiments, the thickness of the low stress moisture resistant layer 80 is greater than or equal to 0.5 µm, and less than or equal to 27 µm. In some other embodiments, the thickness of the low stress moisture resistant layer 80 is greater than or equal to 0.5 µm, and less than or equal to 23 µm. In some embodiments, the thickness of the low stress moisture resistant layer 80 is greater than or equal to 0.5 µm, and less than or equal to 20 µm. In some other embodiments, the thickness of the low stress moisture resistant layer 80 is greater than or equal to 0.5 µm, and less than or equal to 17 nm. In some embodiments, the thickness of the low stress moisture resistant layer 80 is greater than or equal to 0.5 µm, and less than or equal to 13 µm. In some other embodiments, the thickness of the low stress moisture resistant layer 80 is greater than or equal to 0.5 m, and less than or equal to 7 µm. In some embodiments, the thickness of the low stress moisture resistant layer 80 is greater than or equal to 0.5 nm, and less than or equal to 5 µm. In some other embodiments, the thickness of the low stress moisture resistant layer 80 is greater than or equal to 0.5 µm, and less than or equal to 3 µm.

In some embodiments, a thickness of the base covering layer 81 is greater than or equal to 0.01 µm, and less than or equal to 8 µm. In some other embodiments, a thickness of the base covering layer 81 is greater than or equal to 0.01 µm, and less than or equal to 6 µm. In some embodiments, a thickness of the base covering layer 81 is greater than or equal to 0.01 µm, and less than or equal to 4 µm. In some other embodiments, a thickness of the base covering layer 81 is greater than or equal to 0.01 µm, and less than or equal to 3 µm. In some embodiments, a thickness of the base covering layer 81 is greater than or equal to 0.01 µm, and less than or equal to 1.5 µm. In some other embodiments, a thickness of the base covering layer 81 is greater than or equal to 0.01 µm, and less than or equal to 1 µm.

In some embodiments, the dielectric constant of the low stress moisture resistant layer 80 is greater than or equal to 2.0, and less than or equal to 2.8 when measured at 1 MHz. In some other embodiments, the dielectric constant of the low stress moisture resistant layer 80 is greater than or equal to 2.0, and less than or equal to 2.7 when measured at 1 MHz. In some embodiments, the dielectric constant of the low stress moisture resistant layer 80 is greater than or equal to 2.0, and less than or equal to 2.6 when measured at 1 MHz. In some other embodiments, the dielectric constant of the low stress moisture resistant layer 80 is greater than or equal to 2.0, and less than or equal to 2.5 when measured at 1 MHz.

Figure 2K:
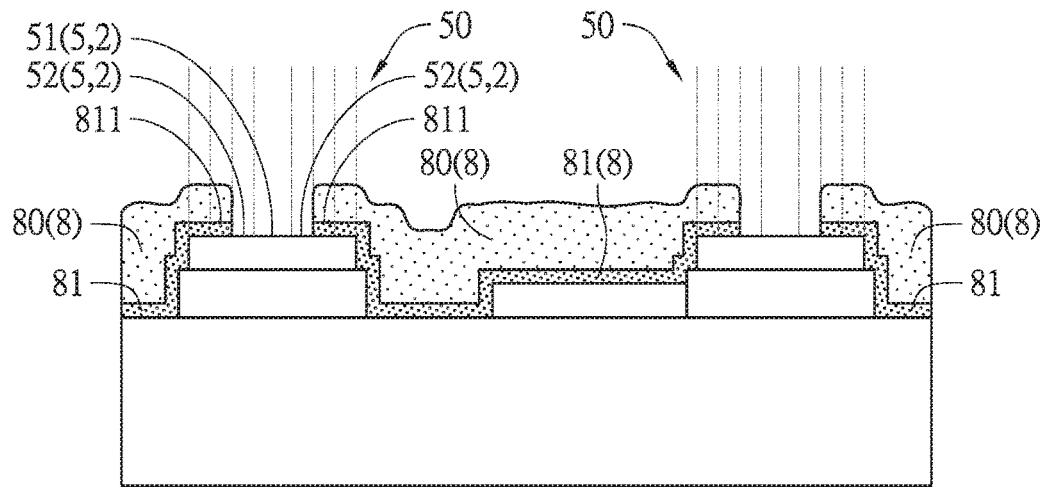
FIG. 2K is a cross-sectional schematic view of another embodiment of a low stress moisture resistant structure of semiconductor device of the present invention.

Please refer to FIG. 2K, which shows a cross-sectional schematic view of another embodiment of a low stress moisture resistant structure of semiconductor device of the present invention. The main structure of the embodiment of FIG. 2K is basically the same as the structure of the embodiment of FIG. 2J, except that, after the photolithography process, the low stress moisture resistant layer 80 of the low stress moisture resistant structure 8 is patterned such that the pad top center surface 51 of the pad top outer surface 5 of each of the pads 50 and the pad top first intermediate surface 52 of the pad top outer surface 5 of each of the pads 50 are exposed. That is that the outside covering second intermediate part outer surface 810 of the outside covering second intermediate part 82 of the base covering layer 81, the covering second intermediate part outer surface 811 of the covering second intermediate part 83 of the base covering layer 81 are covered by the low stress moisture resistant layer 80 of the low stress moisture resistant structure 8.

Figure 2L:
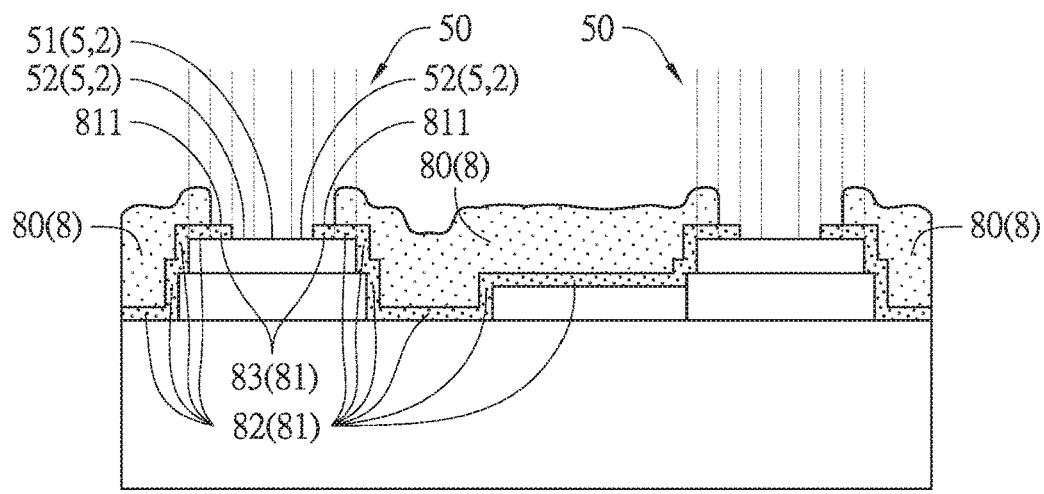
FIG. 2L is a cross-sectional schematic view of an embodiment of a low stress moisture resistant structure of semiconductor device of the present invention.

Please refer to FIG. 2L, which shows a cross-sectional schematic view of an embodiment of a low stress moisture resistant structure of semiconductor device of the present invention. The main structure of the embodiment of FIG. 2L is basically the same as the structure of the embodiment of FIG. 2J, except that, after the photolithography process, the low stress moisture resistant layer 80 of the low stress moisture resistant structure 8 is patterned such that the pad top center surface 51 of the pad top outer surface 5 of each of the pads 50, the pad top first intermediate surface 52 of the pad top outer surface 5 of each of the pads 50, and the covering second intermediate part outer surface 811 of the covering second intermediate part 83 of the base covering layer 81 are exposed. That is that the outside covering second intermediate part outer surface 810 of the outside covering second intermediate part 82 of the base covering layer 81 is covered by the low stress moisture resistant layer 80 of the low stress moisture resistant structure 8.

Figure 2M:
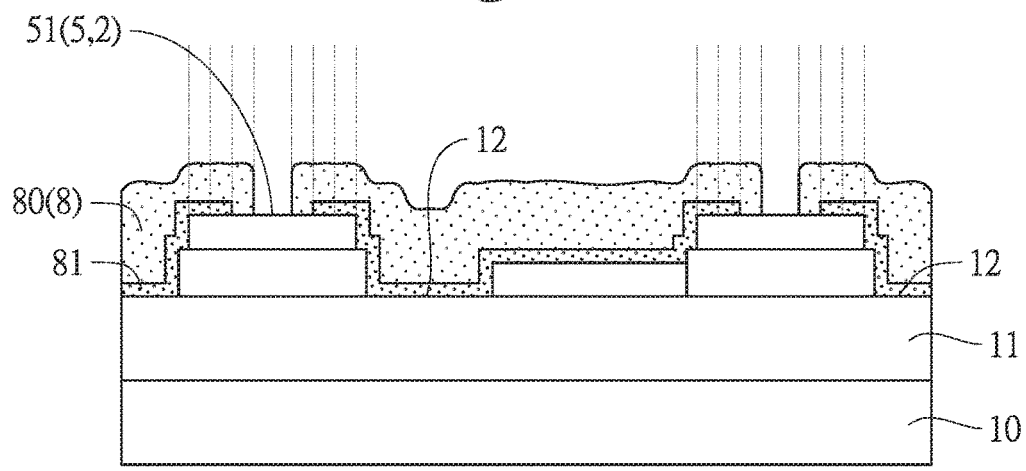
FIG. 2M is a cross-sectional schematic view of another embodiment of a low stress moisture resistant structure of semiconductor device of the present invention.
Figure 3A:
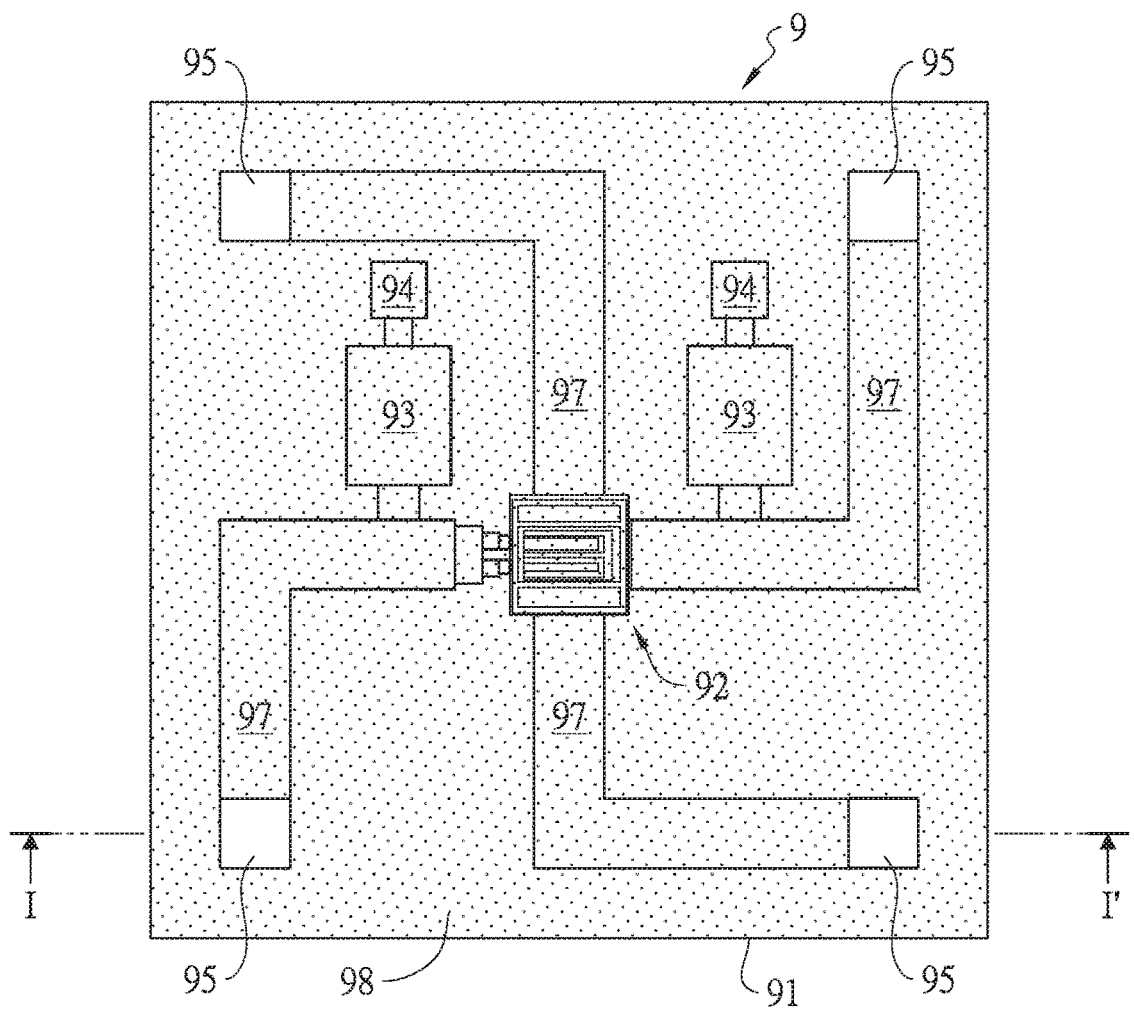
FIG. 3A is a schematic top view of an embodiment of a moisture resistant layer for semiconductor device of conventional technology.
Figure 3B:
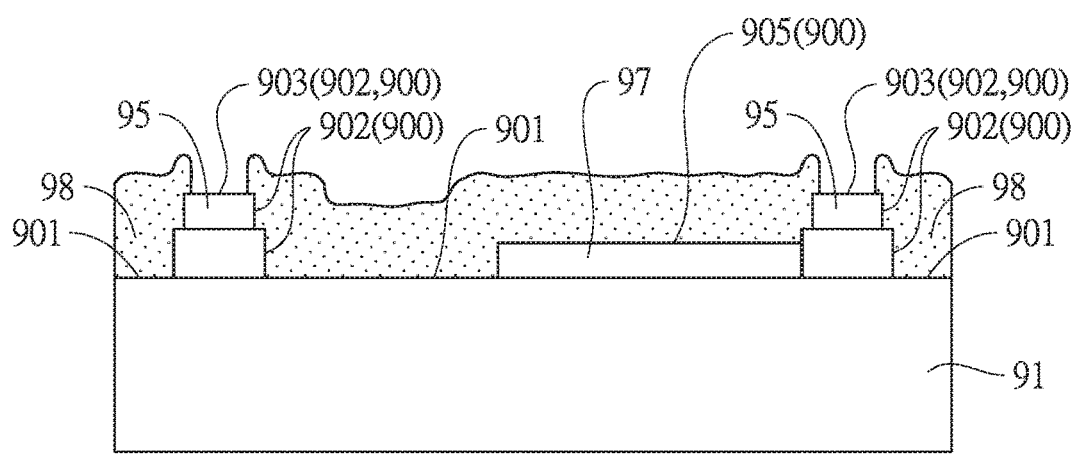
FIG. 3B is a cross-sectional schematic view taken along the section line I-I' of the embodiment of FIG. 3A.
Figure 3C:
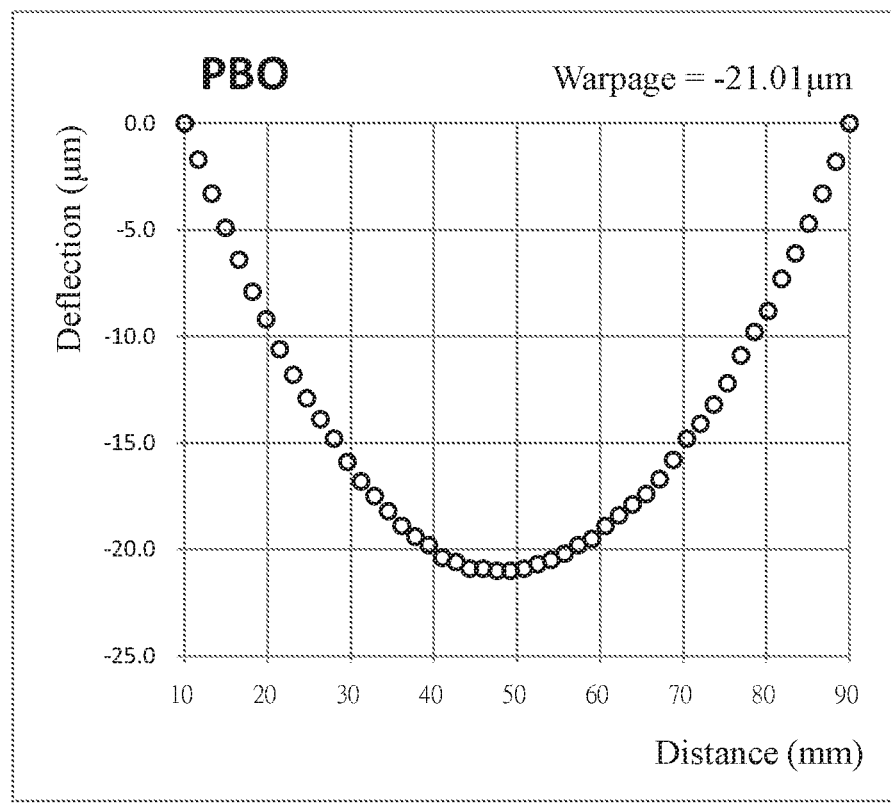
FIG. 3C is the warpage of the semiconductor wafer of an embodiment of a moisture resistant layer (Polybenzoxazole) for semiconductor device of conventional technology.

Please refer to FIG. 2M, which shows a cross-sectional schematic view of another embodiment of a low stress moisture resistant structure of semiconductor device of the present invention. The main structure of the embodiment of FIG. 2L is basically the same as the structure of the embodiment of FIG. 2J, except that, the semiconductor device 1 further comprises an epitaxial structure 11. The epitaxial structure 11 is formed on the semiconductor wafer 10. The device outer surface 2 further includes an epitaxial structure outer surface 12 of epitaxial structure 11.

The term "crosslinkable fluoropolymer" as used herein means an uncrosslinked fluoropolymer that is able to be crosslinked, for example, able to be photocrosslinked when irradiated with the appropriate wavelength of light in the presence of one or more of a photoacid generator and, optionally, a photosensitizer. The term "crosslinked" as used herein is relative to a crosslinked fluoropolymer, wherein the crosslinks within the polymer network are formed as a result of the action of light (photocrosslink), heat or crosslinking agent, or a combination of each. For example, compositions comprising photocrosslinkable fluoropolymer may also contain one or more of a photoacid generator and an optional photosensitizer. Irradiating such a photocrosslinkable fluoropolymer composition with light of the appropriate wavelength generates acid functional molecules that react with the crosslinkable (e.g., silyl ether, epoxide) groups on the photocrosslinkable fluoropolymer resulting in crosslinking of the photocrosslinkable fluoropolymer.

The present low stress moisture resistant layer of the present low stress moisture resistant structure of a semiconductor device comprises crosslinked fluoropolymer. The crosslinked fluoropolymer is obtained from crosslinkable fluoropolymer, which is coated on a present semiconductor device and thereafter crosslinked resulting in the present low stress moisture resistant layer.

The present crosslinkable fluoropolymer has crosslinkable groups. The crosslinkable groups can be located on the main chain, side chains or chain ends of the crosslinkable fluoropolymer, or both. By crosslinkable groups are meant chemical groups that are stable under the conditions of synthesis and coating of the present crosslinkable fluoropolymer, and thereafter are allowed to chemically react, in the presence or absence of crosslinking agent and optional other additives, to form new covalent bonds within the fluoropolymer that result in the present crosslinked fluoropolymer. Representative crosslinkable groups are those selected from the group consisting of carboxyl or a salt thereof, anhydrous carboxylic acid, amino, hydroxyl, epoxy, methylol, mercapto, isocyanate, silanol, siloxane, silyl ether, carbon-carbon double bond (alkenyl), ester, tetrazole, acrylate, methacrylate and styryl. Preferred of the crosslinkable groups are epoxy and those containing silicon-oxygen linkages such as siloxane and silyl ether.

In one embodiment the crosslinkable fluoropolymer comprises repeat units arising from a first olefin having a crosslinkable group and repeat units arising from a fluoroolefin.

In a preferred embodiment the crosslinkable fluoropolymer comprises repeat units arising from a first olefin having a crosslinkable group, repeat units arising from a fluoroolefin, and repeat units arising from a second olefin. In one embodiment, the amount of repeat units in the crosslinkable fluoropolymer arising from fluoroolefin is about 40 to about 60 mole percent, the amount of repeat units arising from second olefin is about 40 to about 60 mole percent, and the amount of repeat units arising from first olefin having a crosslinkable group is about 0.2 to about 10 mole percent. In another embodiment, the amount of repeat units in the crosslinkable fluoropolymer arising from fluoroolefin is about 40 to about 60 mole percent, the amount of repeat units arising from second olefin is about 40 to about 60 mole percent, and the amount of repeat units arising from first olefin having a crosslinkable group is about 1.2 to about 8 mole percent. In another embodiment, the amount of repeat units in the crosslinkable fluoropolymer arising from fluoroolefin is about 40 to about 60 mole percent, the amount of repeat units arising from second olefin is about 40 to about 60 mole percent, and the amount of repeat units arising from first olefin having a crosslinkable group is about 1.4 to about 7 mole percent.

Without wishing to be bound by theory, in the crosslinkable fluoropolymer, it is believed that the olefin of the first olefin having a crosslinkable group is incorporated into the crosslinkable fluoropolymer backbone as a repeat unit, leaving the crosslinkable group remaining unreacted and stable during manipulation of the crosslinkable fluoropolymer (e.g., crosslinkable fluoropolymer synthesis, isolation, purification, and coating on a device) up until the crosslinkable fluoropolymer is crosslinked.

To assure that the present low stress moisture resistant layer is most resistant to moisture uptake, and further has as low a dielectric constant as possible for good electrical performance, it preferred that the crosslinkable fluoropolymer contain a maximal fluorine content, so long as the fluorine content does not negatively effect the other desirable properties of the crosslinkable fluoropolymer the resultant crosslinked fluoropolymer and coatings thereof. In one embodiment the crosslinkable fluoropolymer comprises 20 or greater weight percent fluorine, based on the weight of all repeating units comprising the crosslinkable fluoropolymer. In another embodiment the crosslinkable fluoropolymer comprises 30 or greater weight percent fluorine. In a preferred embodiment the crosslinkable fluoropolymer comprises 40 or greater weight percent fluorine.

In one embodiment, repeat units in the crosslinkable fluoropolymer arising from first olefin having a crosslinkable group are repeat units arising from ethylenically unsaturated silane of the formula SiR1R2R3R4, wherein R1 is an ethylenically unsaturated hydrocarbon radical, R2 and R3 are independently selected from substituted or unsubstituted aryl, substituted or unsubstituted aryl substituted hydrocarbon radical, substituted or unsubstituted linear or branched alkoxy radical, substituted or unsubstituted cyclic alkoxy radical, substituted or unsubstituted linear or branched alkyl radical, or substituted or unsubstituted cyclic alkyl radical, and R4 is substituted or unsubstituted linear or branched alkoxy radical, or substituted or unsubstituted cyclic alkoxy radical. In a preferred embodiment the repeat units in the crosslinkable fluoropolymer arising from first olefin having a crosslinkable group is a repeat unit arising from ethylenically unsaturated silane of the formula SiR1R2R3R4, wherein R1 is an ethylenically unsaturated hydrocarbon radical, R2 is aryl, aryl substituted hydrocarbon radical, branched C3-C6 alkoxy radical, or substituted or unsubstituted cyclic C5-C6 alkoxy radical, and R3 and R4 are independently selected from linear or branched C1-C6 alkoxy radical, or substituted or unsubstituted cyclic C5-C6 alkoxy radical.

Example ethylenically unsaturated silanes include: vinyltriisopropoxysilane, allyltriisopropoxysilane, butenyltriisopropoxysilane, and vinylphenyldimethoxysilane. In a preferred embodiment, the ethylenically unsaturated silane is vinyltriisopropoxysilane. In some embodiments, the ethylenically unsaturated silane consists of, or consists essentially of vinyltriisopropoxysilane. Such ethylenically unsaturated silanes are commercially available, for example from Gelest Inc., Morrisville, Pa., USA.

In one embodiment, the repeat units in the crosslinkable fluoropolymer arising from first olefin having a crosslinkable group is a repeat unit arising from an ethylenically unsaturated epoxide. Representative ethylenically unsaturated epoxides include allyl glycidyl ether, glycidyl acrylate and glycidyl methacrylate.

In one embodiment, the repeat units in the crosslinkable fluoropolymer arising from fluoroolefin is a repeat unit arising from a fluoroolefin containing from 2 to 6 carbon atoms and at least 60 weight percent fluorine. In another embodiment, the fluoroolefin contains from 2 to 6 carbon atoms and at least 70 weight percent fluorine. In another embodiment, the fluoroolefin contains from 2 to 6 carbon atoms and is perfluorinated. Representative fluoroolefins include at least one selected from the group consisting of tetrafluoroethylene, chlorotrifluoroethylene, hexafluoropropylene, trifluoroethylene, perfluoro(methyl vinyl ether), perfluoro(ethyl vinyl ether), and perfluoro(propyl vinyl ether), vinyl fluoride, vinylidene fluoride, perfluorodimethyldioxole, trifluoropropylene, perfluoro(2-methylene-4-methyl-1,3-dioxolane, hexafluoroisobutylene, methyl 3-[1-[difluoro[(trifluorovinyl)oxy]methyl]-1,2,2,2-tetrafluoroethoxy]-2,2,3,3-tetrafluoropropionate, 2-[1-[difluoro[(1,2,2-trifluoroethenyl)oxy]methyl]-1,2,2,2-tetrafluoro-ethoxy]-1,1,2,2-tetrafluoro-ethanesulfonyl fluoride. A preferred fluoroolefin is tetrafluoroethylene.

In one embodiment, the repeat units in the crosslinkable fluoropolymer arising from second olefin are repeat unit arising from a second olefin containing from 2 to 12 carbon atoms, and comprising the elements C, H and optionally, at least one heteroatom selected from O, N and S and halogens F, Cl and Br. In another embodiment, the repeat units arising from second olefin are repeat units arising from a second olefin containing from 2 to 12 carbon atoms, and consisting of the elements C, H and O. In one embodiment, the second olefin is non-fluorinated. In one embodiment, the second olefin is an alkyl vinyl ether wherein the alkyl group is a C1 to C6 straight chain alkyl radical or a C3 to C6 branched chain or cyclic alkyl radical, or aryl vinyl ether wherein the aryl group is unsubstituted or substituted. Representative second olefins include alkyl vinyl ethers, including methyl vinyl ether, ethyl vinyl ether, n-propyl vinyl ether, isopropyl vinyl ether, n-butyl vinyl ether, sec-butyl vinyl ether, t-butyl vinyl ether, n-pentyl vinyl ether, isoamyl vinyl ether, hexyl vinyl ether, and cyclohexyl vinyl ether. In some embodiments, the alkyl vinyl ether consists of or consists essentially of methyl vinyl ether, ethyl vinyl ether, n-propyl vinyl ether, isopropyl vinyl ether or a combination thereof. Aryl vinyl ether as used herein are those wherein the aryl group is unsubstituted (phenyl) or substituted (e.g., alkylphenyl (e.g., tolyl, xylyl, —$C_6CH_4(CH_2CH_3)$), halophenyl, aminophenyl). Example aryl vinyl ethers include phenyl vinyl ether. Preferred second olefins are methyl vinyl ether and ethyl vinyl ether.

In one embodiment the crosslinkable fluoropolymer comprises repeat units arising from the monomers comprising: (a) fluoroolefin selected from the group consisting of tetrafluoroethylene, chlorotrifluoroethylene, hexafluoropropylene, perfluoro(methyl vinyl ether), perfluoro(ethyl vinyl ether), and perfluoro(propyl vinyl ether): (b) alkyl vinyl ether wherein the alkyl group is a C1 to C6 straight chain alkyl radical or a C3 to C6 branched chain or cyclic alkyl radical, or aryl vinyl ether wherein the aryl group is unsubstituted or substituted; and (c) ethylenically unsaturated silane of the formula SiR1R2R3R4, wherein R1 is an ethylenically unsaturated hydrocarbon radical, R2 is aryl, aryl substituted hydrocarbon radical, branched C3-C6 alkoxy radical, or substituted or unsubstituted cyclic C5-C6 alkoxy radical, and R3 and R4 are independently selected from linear or branched C1-C6 alkoxy radical, or substituted or unsubstituted cyclic C5-C6 alkoxy radical.

In one embodiment the crosslinkable fluoropolymer comprises repeat units arising from the monomers comprising: (a) tetrafluoroethylene, and the amount of repeat units in the crosslinkable fluoropolymer arising from tetrafluoroethylene is about 40 to about 60 mole percent; (b) methyl vinyl ether or ethyl vinyl ether, and the amount of repeat units in the crosslinkable fluoropolymer arising from methyl vinyl ether or ethyl vinyl ether is about 40 to about 60 mole percent, and; (c) vinyltriisopropoxysilane, and the amount of repeat units in the crosslinkable fluoropolymer arising from the vinyltriisopropoxysilane is about 0.2 to about 10 mole percent.

In accordance with some embodiments, the crosslinkable fluoropolymer has a weight average molecular weight of from 10,000 to 350,000 daltons. In accordance with other embodiments, the crosslinkable fluoropolymer has a weight average molecular weight of from 100,000 to 350,000 daltons. In other embodiments, crosslinkable fluoropolymer weight average molecular weight can be in a range comprising a minimum weight average molecular weight to a maximum weight average molecular weight wherein the minimum is 10,000, or 20,000, or 30,000, or 40,000, or 50,000, or 60,000, or 70,000, or 80,000, or 90,000, or 100,000, or 110,000, or 120,000, or 125,000, or 130,000, or 140,000, or 150,000, or 160,000 or 170,000 and the maximum is 350,000, or 340,000, or 330,000, or 320,000, or 310,000 or 300,000 daltons. In one embodiment the crosslinkable fluoropolymer has a weight average molecular weight of 200,000 daltons.

The crosslinkable fluoropolymer can be produced according to known methods. For example, such as those taught in WIPO PCT publication WO2017/136,266 (crosslinkable fluoropolymer containing repeating units arising from ethylenically unsaturated silane) and WIPO PCT publication WO2015/187,413 (crosslinkable fluoropolymer containing repeating units arising from ethylenically unsaturated epoxide). In some embodiments, the monomers can be polymerized without the use of a solvent, and in other embodiments the monomers can be polymerized in a solvent, which may or may not be a solvent for the crosslinkable fluoropolymer. In other embodiments, the crosslinkable fluoropolymer can be produced by the emulsion polymerization of the monomers. Typically, to produce the desired crosslinkable fluoropolymer, the monomers, at least one free radical initiator and, optionally, an acid acceptor can be charged to an autoclave and heated to a temperature of from 25° C. to 200° C. for 10 minutes to 24 hours at a pressure of from atmospheric pressure to as high as 1,500 atmospheres. The resulting product can then be removed from the autoclave, filtered and dried to give the crosslinkable fluoropolymer.

In one embodiment, the present low stress moisture resistant layer of the present low stress moisture resistant structure of a semiconductor device is formed from a coating composition for forming the crosslinked fluoropolymer coating, the coating composition comprising i) crosslinkable fluoropolymer, ii) a photoacid generator, iii) an optional photosensitizer; and iv) a carrier medium. The coating composition can also optionally comprise v) an additive. The coating composition enables the manufacture of a continuous coating of the crosslinkable fluoropolymer on the semiconductor device, after which the crosslinkable fluoropolymer is crosslinked (e.g., photocrosslinked). The coating composition can be prepared by simply mixing the components together at room temperature in the desired proportions. The major components of the coating composition are the crosslinkable fluoropolymer and the carrier medium. Generally, the coating composition comprises from 5 to 35 weight percent of crosslinkable fluoropolymer and from 65 to 95 weight percent of carrier medium. Above 35 weight percent crosslinkable fluoropolymer the viscosity of the coating composition becomes difficult to coat at room temperature. Below 5 weight percent of crosslinkable fluoropolymer the thickness of the films generated (in a one coat coating process) become too thin for utility. In some embodiments the coating composition comprises from 10 to 30 weight percent of crosslinkable fluoropolymer and from 70 to 90 weight percent of carrier medium.

In the photocrosslinking embodiment, suitable ii) photoacid generators are known in the art and can include, for example, (p-isopropylphenyl)(p-methylphenyl)iodonium tetrakis(pentafluorophenyl)-borate, IRGACURE® GSID-26-1 which is a salt of tris[4-(4-acetylphenyl)sulfanylphenyl] sulfonium and tris(trifluoromethanesulfonyl)methide and is available from BASF, Florham Park, N.J., bis(1,1-dimethylethylphenyl)iodonium salt with tris[(trifluoromethane)sulfonyl]methane also available from BASF, bis(4-decylphenyl)iodonium hexafluoroantimonate oxirane, mono [(C12-C14-alkoxy)methyl]derivatives, available from Momentive as UV9387C, 4,4',4"-tris(t-butylphenyl)sulfonium triflate, 4,4'-di-t-butylphenyl iodonium triflate, diphenyliodonium tetrakis(pentafluorophenyl)sulfonium borate, triarylsulfonium-tetrakis(pentafluorophenyl) borate, triphenylsulfonium tetrakis(pentafluorophenyl) sulfonium borate, 4,4'-di-t-butylphenyl iodonium tetrakis(pentafluorophenyl) borate, tris(t-butylphenyl) sulfonium tetrakis(pentafluorophenyl) borate, 4-methylphenyl-4-(1-methylethyl) phenyl iodonium tetrakis(pentafluorophenyl) borate or a combination thereof. IRGACURE® GSID-26-1 photoacid generator is especially useful as it does not require the separate addition of a photosensitizer. The photoacid generator can be present in the coating composition in an amount from 0.01 to 5 percent by weight, based on the total amount of the coating composition minus carrier medium. In other embodiments, the photo acid generator can be present from 0.1 to 2 percent by weight, and, in still further embodiments, can be present in an amount from 0.3 to 1.0 percent by weight, based on the total amount of the coating composition minus carrier medium.

The coating composition for forming the present crosslinkable fluoropolymer coating can also optionally comprise a iii) photosensitizer. Suitable photosensitizers can include, for example, chrysenes, benzpyrenes, fluoranthrenes, pyrenes, anthracenes, phenanthrenes, xanthones, indanthrenes, thioxanthen-9-ones or a combination thereof. In some embodiments, the photosensitizer can be 2-isopropyl-9H-thioxanthen-9-one, 4-isopropyl-9H-thioxanthen-9-one, 1-chloro-4-propoxythioxanthone, 2-isopropylthioxanthone, phenothiazine or a combination thereof. The optional photosensitizer can be used in an amount from 0 to 5 percent by weight, the percentage by weight based on the total amount of the coating composition minus carrier medium. In other embodiments, the photosensitizer can be present in the coating composition in an amount from 0.05 to 2 percent by weight, and, in still further embodiments, from 0.1 to 1 percent by weight. All percentages by weight reported for photoacid generator and photosensitizer in the present coating compositions are based on the total weight of solid components in the coating composition.

The coating composition for forming the crosslinked fluoropolymer coating is typically applied to at least a portion of a semiconductor device as a solution or dispersion of the coating composition in iv) a carrier medium (solvent). This allows a layer of the coating composition to be applied and results in a smooth defect-free layer of coating composition on the semiconductor device. Suitable carrier medium can include, for example, ketones, ethers, ether esters and halocarbons. In some embodiments, for example, the carrier medium can be a ketone, for example, acetone, acetylacetone, methyl ethyl ketone, methyl isobutyl ketone, methyl amyl ketone, 2-pentanone, 3-pentanone, 2-heptanone, 3-heptanone, cyclopentanone, cyclohexanone; ester, for example, ethyl acetate, propyl acetate, butyl acetate, isobutyl acetate, pentyl acetate, cyclohexyl acetate, heptyl acetate, ethyl propionate, propyl propionate, butyl propionate, isobutyl propionate, propylene glycol monomethyl ether acetate, propylene glycol monoethyl ether acetate, methyl lactate, ethyl lactate, gamma-butyrolactone; ether, for example, diisopropyl ether, dibutyl ether, ethyl propyl ether, anisole; or halocarbon, for example, dichloromethane, chloroform, tetrachloroethylene; or a combination thereof of the named carrier medium. In some embodiments, the carrier medium is methyl isobutyl ketone, 2-heptanone, propylene glycol methyl ether acetate or a combination thereof. In some embodiments, the solvent is an unreactive solvent, meaning that the carrier medium does not become a part of the photocrosslinked coating after the curing step.

The crosslinkable coating composition can also comprise v) one or more optional additives. Suitable additives can include, for example, adhesion promoters, viscosity modulators, fillers, dispersants, binding agents, surfactants, antifoaming agents, wetting agents, pH modifiers, biocides, bacteriostats or a combination thereof. Such additives are well known in the art. Typically, such additives comprise less than 10 percent by weight of the coating composition.

In one embodiment, the crosslinkable coating composition includes as an additive adhesion promoter. In one embodiment, the adhesion promoter is a thiol-based adhesion promoter. In another embodiment, the adhesion promoter is a diol-based adhesion promoter. Example thiol-based adhesion promoters include sulfur functionalized carboxylic acids, sulfur functionalized alcohols, and sulfur functionalized silanes. Specific examples of thiol-based adhesion promoters include 3-(triethoxysilyl) propanethiol (MPTES), 6-mercapto-1-hexanol, 3-mercaptopropionic acid, 11-mercapto-1-undecanol and 3-(trimethoxysilyl) propanethiol (MPTMS). Example diol-based adhesion promoters include 1,n-hydrocarbon diols wherein n corresponds to a 2 to 6 carbon hydrocarbon, and alkyl substituted 1,2-benzenediols. Specific examples of diol-based adhesion promoters include 4-tert-butylbenzene-1,2-diol, hexane-1,6-diol and 1,3-butylene glycol.

In one embodiment the adhesion promoter includes a first adhesion promoter comprising a thiol-based adhesion promoter and a second adhesion promoter comprising a diol-based adhesion promoter. In this embodiment, the effects of adhesion to an adherend surface and pattern formability are superior. In one embodiment, the first adhesion promoter comprises one or more selected from the group consisting of 3-(triethoxysilyl) propanethiol (MPTES), 6-mercapto-1-hexanol, 3-mercaptopropionic acid, 11-mercapto-1-undecanol and 3-(trimethoxysilyl) propanethiol (MPTMS), preferably 3-(triethoxysilyl) propanethiol (MPTES), and the second adhesion promoter comprises one or more selected from the group consisting of 4-tert-butylbenzene-1,2-diol, hexane-1,6-diol and 1,3-butylene glycol, preferably 4-tert-butylbenzene-1,2-diol. When the first adhesion promoter and the second adhesion promoter each include a preferable material, it can be very advantageous in terms of adhesion to an adherend surface and pattern formability.

In one embodiment the weight ratio of the first adhesion promoter to the second adhesion promoter is from 1:0.5 to 3.5, preferably 1:1 to 2.5. When the weight ratio of the first adhesion promoter and a second adhesion promoter is less than 1:0.5 or more than 1:3.5, the adhesion between the crosslinked fluoropolymer and the semiconductor device surface cannot be improved to a desired level, and pattern formability may be deteriorated.

In one embodiment, the adhesion promoter may be included at 0.5 to 3.5 parts by weight, and preferably, at 1 to 2.5 parts by weight based on 100 parts by weight of the crosslinkable fluoropolymer. When the adhesion promoter is included at less than 0.5 part by weight based on 100 parts by weight of the crosslinkable fluoropolymer, the adhesion between the crosslinked fluoropolymer and the semiconductor device surface cannot be improved to a desired level, and pattern formability may be deteriorated. When the adhesion promoter is included at more than 3.5 parts by weight, peeling of the crosslinked fluoropolymer layer may rather occur, stability of a composition may be lowered, and pattern formability may be deteriorated.

In one embodiment, the present low stress moisture resistant layer of the present low stress moisture resistant structure of a semiconductor device comprising crosslinked fluoropolymer can be prepared by a process comprising: (1) providing a crosslinkable coating composition comprising: i) a crosslinkable fluoropolymer; ii) a photoacid generator; iii) an optional photosensitizer; iv) a carrier medium; and v) optional additives such as adhesion promoter; (2) applying a layer of the crosslinkable coating composition onto at least a portion of a semiconductor device; (3) removing at least a portion of the carrier medium; (4) irradiating at least a portion of the layer of the crosslinkable coating composition with ultraviolet light; (5) heating the applied layer of crosslinkable coating composition; and (6) removing at least a portion of the uncrosslinked photocrosslinkable fluoropolymer.

The layer of the crosslinkable coating composition can be applied to a variety of semiconductor device substrates, including electrically conductive materials, semiconductive materials and/or nonconductive materials. For example, the substrate can be glass, polymeric, inorganic semiconductor, organic semiconductor, tin oxide, zinc oxide, titanium dioxide, silicon dioxide, indium oxide, indium zinc oxide, zinc tin oxide, indium gallium oxide, gallium nitride, gallium arsenide, indium gallium zinc oxide, indium tin zinc oxide, cadmium sulfide, cadmium selenide, silicon nitride, copper, aluminum, gold, titanium, silicon carbide or a combination thereof. The layer of the crosslinkable coating composition can be applied by spin coating, spray coating, flow coating, curtain coating, roller coating, brushing, inkjet printing, screen printing, offset printing, gravure printing, flexographic printing, lithographic printing, dip coating, blade coating or drop coating methods. Spin coating involves applying an excess amount of the crosslinkable coating composition to the substrate, then rotating the substrate at high speeds to spread the composition by centrifugal force. The thickness of the resultant film can be dependent on the spin coating rate, the concentration of the crosslinkable coating composition, as well as the carrier medium used. Ambient conditions such as temperature, pressure, and humidity can also effect the thickness of the applied layer of crosslinkable coating composition.

After application to the substrate and prior to irradiation (photocrosslinking), at least a portion of the carrier medium can be removed by exposing the applied layer of coating composition to elevated temperatures, exposure to less than atmospheric pressure, by directly or indirectly blowing gas onto the applied layer, or by using a combination of these methods. For example, the applied layer of coating composition may be heated in air or in a vacuum oven optionally with a small purge of nitrogen gas. In other embodiments, the applied layer of coating composition can be heated to a temperature of from 60 to 110° C. in order to remove the carrier medium.

At least a portion of the applied layer of crosslinkable coating composition can then be irradiated (i.e., photocrosslinked) by exposure to light. The light is typically ultraviolet (UV) light at a wavelength of 150 to 500 nanometers (nm). In some embodiments, the ultraviolet light can be at a wavelength of from 200 to 450 nanometers, and, in other embodiments, from 325 to 425 nm. In still further embodiments, the exposure can be carried out by exposure to multiple wavelengths, or by irradiation at selected wavelengths, for example, 404.7 nanometers, 435.8 nanometers or 365.4 nanometers. Many suitable UV lamps are known in the industry and can be used.

The crosslinkable coating composition can be crosslinked using UV light. Crosslinking can be achieved when the total exposure to the light source is from 10 millijoules/centimeter$^2$ (millijoules/cm$^2$) to 10,000 millijoules/cm$^2$. In other embodiments, the ultraviolet light exposure can be from 50 to 1000 millijoules/cm$^2$. Exposure can be carried out in air or a nitrogen atmosphere.

In order to form the desired crosslinked features or pattern of crosslinked fluoropolymer on the semiconductor device surface, at least a portion of the applied layer of crosslinkable coating composition can be irradiated to begin the crosslinking process only to those portions that were irradiated. The applied layer of crosslinkable coating composition can be masked or the step of irradiation can be performed using a focused light source so that the light contacts only those portions that are to be crosslinked. These techniques are well-known in the art. For example, a mask can be applied directly to the applied layer of crosslinkable coating composition. This method is known as contact printing. In another embodiment, called proximity printing, the mask is held slightly above the applied layer of crosslinkable coating composition without actually contacting the layer. In a third embodiment, a projection printing uses a stepper to expose one part of the wafer to the light, and then steps to the next location and repeats the exposure. In a fourth embodiment, an e-beam direct writing that precisely focuses the e-beam so that an actual physical mask is not needed. In some embodiments, the mask can be a chrome or other metal mask.

After exposure to UV light, the layer of coating composition can be heated. The heating step can be done at a temperature of from 60 to 250° C. In other embodiments, the heating can be done at a temperature of from 60 to 130° C. and in still further embodiments, at a temperature of from 80° C. to 110° C. The coating composition can be exposed to the elevated temperature for 15 seconds to 10 minutes. In other embodiments, the time can be from 30 seconds to 5 minutes, and in still further embodiments, from 1 to 3 minutes.

Once the coating composition has been heated, uncrosslinked crosslinkable coating composition can be removed by dissolving in a carrier medium that dissolves the uncrosslinked crosslinkable fluoropolymer. Occasionally, a small amount of uncrosslinked crosslinkable coating composition can remain after the removal step. Remaining such fluoropolymer can be removed if necessary using plasma or a second wash step. The carrier medium can be a mixture of a solvent and a nonsolvent for the crosslinkable fluoropolymer. In some embodiments, the ratio of solvent to nonsolvent can be from 1:0 to 3:1. In other embodiments, the ratio of solvent to nonsolvent can be from 1:0.1 to 3:1. The solvents can be any of those that are listed as carrier medium that have the ability to solvate the uncrosslinked crosslinkable fluoropolymer. In some embodiments, the solvent can be methyl isobutyl ketone, 2-heptanone, propylene glycol monomethyl ether acetate or a combination thereof. In other embodiments, the nonsolvent can be hexane and/or isopropanol. In some embodiments, the application of the solvents to remove uncrosslinked crosslinkable coating composition can be carried out in a step-wise fashion. In one embodiment, a two step process can be used, wherein the first step involves treatment with solvent or mixture of a solvent and a nonsolvent, and the second step involves treatment with nonsolvent or a mixture of a solvent and a nonsolvent. In another embodiment, a multi-step process can be used, for example a three step process, wherein the first step involves treatment with solvent, the second step involves treatment with a mixture of a solvent and a nonsolvent, and the third step involves treatment with nonsolvent.

In some embodiments, after removal of uncrosslinked crosslinkable coating composition using solvent, the substrate containing the applied layer of low stress moisture resistant layer crosslinked coating can be final thermally cured, sometimes referred to in this field as "hard baking". This heating step can be carried out on the present photo-crosslinked coating composition at a temperature of from 170° C. to 250° C., preferably 190° C., for a time period of from 0.5 to 3 hours. In other embodiments, this heating step can be carried out at even higher temperatures, and for relatively shorter periods of time, provided that these higher temperatures do not negatively effect the coated semiconductor device. The final hard baking step provides the present low stress moisture resistant layer of the present low stress moisture resistant structure of a semiconductor device comprising crosslinked fluoropolymer, and the resultant electronic semiconductor device can then be further processed as necessary.

As disclosed in the above description and attached drawings, the present invention can provide a low stress moisture resistant structure of semiconductor device. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A low stress moisture resistant structure of semiconductor device,
    wherein a semiconductor device is formed on a semiconductor wafer,
    wherein said semiconductor wafer has a wafer outer surface,
    wherein said semiconductor device comprises at least one pad,
    wherein said semiconductor device has a device outer surface,
    wherein said device outer surface includes a pad top outer surface of each of said at least one pad and an outside pad top device outer surface,
    wherein said pad top outer surface of each of said at least one pad includes a pad top center surface and a pad top peripheral surface,
    wherein said low stress moisture resistant structure comprises:
        a low stress moisture resistant layer coated on said wafer outer surface, said outside pad top device outer surface, and said pad top peripheral surface of said pad top outer surface of each of said at least one pad so that said pad top center surface of said pad top outer surface of each of said at least one pad is exposed,
    wherein said low stress moisture resistant layer comprises a material comprising crosslinked fluoropolymer,
    wherein a before-coated stress measured on said semiconductor wafer before said low stress moisture resistant layer is coated and an after-cured stress measured on said semiconductor wafer after said low stress moisture resistant layer is coated and cured define a stress difference, and wherein said stress difference is greater than or equal to $-5\times10^7$ dyne/cm$^2$ and less than or equal to $5\times10^7$ dyne/cm$^2$.

2. The low stress moisture resistant structure of semiconductor device according to claim 1, wherein said low stress moisture resistant layer is photodefined.

3. The low stress moisture resistant structure of semiconductor device according to claim 2, wherein said low stress moisture resistant layer is patterned by a photolithography process.

4. The low stress moisture resistant structure of semiconductor device according to claim 1, wherein said low stress moisture resistant layer is cured at greater than or equal to 170° C. and less than or equal to 250° C.

5. The low stress moisture resistant structure of semiconductor device according to claim 1, wherein said semiconductor wafer is made of Silicon or Diamond.

6. The low stress moisture resistant structure of semiconductor device according to claim 1, wherein said semiconductor wafer is a compound semiconductor wafer.

7. The low stress moisture resistant structure of semiconductor device according to claim 6, wherein said semiconductor wafer is made of one material selected from the group consisting of: GaAs, sapphire, InP, SiC, SOI and GaN.

8. The low stress moisture resistant structure of semiconductor device according to claim 1, wherein a thickness of said low stress moisture resistant layer is greater than or equal to 0.5 μm, and said thickness of said low stress moisture resistant layer is less than or equal to 30 μm.

9. The low stress moisture resistant structure of semiconductor device according to claim 8, wherein said thickness of said low stress moisture resistant layer is greater than or equal to 0.5 μm, and said thickness of said low stress moisture resistant layer is less than or equal to 10 μm.

10. The low stress moisture resistant structure of semiconductor device according to claim 1, wherein said semiconductor device comprises an epitaxial structure, wherein said device outer surface includes an epitaxial structure outer surface of said epitaxial structure.

11. The low stress moisture resistant structure of semiconductor device according to claim 1, wherein a dielectric constant of said low stress moisture resistant layer is greater than or equal to 2.0, and less than or equal to 2.9 when measured at 1 MHz.

12. The low stress moisture resistant structure of semiconductor device according to claim 1, wherein the fluoropolymer of said crosslinked fluoropolymer comprises crosslinkable fluoropolymer having crosslinkable groups.

13. The low stress moisture resistant structure of semiconductor device according to claim 12, wherein the fluoropolymer of said crosslinked fluoropolymer comprises crosslinkable fluoropolymer comprising repeat units arising from a first olefin having a crosslinkable group and repeat units arising from a fluoroolefin.

14. The low stress moisture resistant structure of semiconductor device according to claim 13, wherein said repeat units arising from a first olefin having a crosslinkable group is a repeat unit arising from ethylenically unsaturated silane of the formula SiR1R2R3R4, wherein R1 is an ethylenically unsaturated hydrocarbon radical, R2 and R3 are independently selected from substituted or unsubstituted aryl, substituted or unsubstituted aryl substituted hydrocarbon radical, substituted or unsubstituted linear or branched alkoxy radical, substituted or unsubstituted cyclic alkoxy radical, substituted or unsubstituted linear or branched alkyl radical, or substituted or unsubstituted cyclic alkyl radical, and R4 is substituted or unsubstituted linear or branched alkoxy radical, or substituted or unsubstituted cyclic alkoxy radical.

15. The low stress moisture resistant structure of semiconductor device according to claim 13, wherein said repeat units arising from first olefin having a crosslinkable group is a repeat unit arising from ethylenically unsaturated silane of the formula SiR1R2R3R4, wherein R1 is an ethylenically unsaturated hydrocarbon radical, R2 is aryl, aryl substituted hydrocarbon radical, branched C3-C6 alkoxy radical, or substituted or unsubstituted cyclic C5-C6 alkoxy radical, and R3 and R4 are independently selected from linear or branched C1-C6 alkoxy radical, or substituted or unsubstituted cyclic C5-C6 alkoxy radical.

16. The low stress moisture resistant structure of semiconductor device according to claim 13, wherein said repeat units arising from a first olefin having a crosslinkable group is a repeat unit arising from an ethylenically unsaturated epoxide.

17. The low stress moisture resistant structure of semiconductor device according to claim 13, wherein said repeat units arising from a first olefin having a crosslinkable group is a repeat unit arising from an ethylenically unsaturated epoxide selected from the group consisting of allyl glycidyl ether, glycidyl acrylate and glycidyl methacrylate.

18. The low stress moisture resistant structure of semiconductor device according to claim 13, wherein said fluoroolefin contains from 2 to 6 carbon atoms and at least 60 weight percent fluorine.

19. The low stress moisture resistant structure of semiconductor device according to claim 13, wherein said fluoroolefin contains from 2 to 6 carbon atoms and is perfluorinated.

20. The low stress moisture resistant structure of semiconductor device according to claim 12, wherein the fluoropolymer of said crosslinked fluoropolymer comprises crosslinkable fluoropolymer comprising repeat units arising from a first olefin having a crosslinkable group, repeat units arising from a fluoroolefin, and repeat units arising from a second olefin.

21. The low stress moisture resistant structure of semiconductor device according to claim 20, wherein the amount of repeat units in said fluoropolymer arising from said fluoroolefin is about 40 to about 60 mole percent, wherein the amount of repeat units in said fluoropolymer arising from said second olefin is about 40 to about 60 mole percent, and wherein the amount of repeat units in said fluoropolymer arising from said first olefin having a crosslinkable group is about 0.2 to about 10 mole percent.

22. The low stress moisture resistant structure of semiconductor device according to claim 20, wherein said repeat units arising from a first olefin having a crosslinkable group is a repeat unit arising from ethylenically unsaturated silane of the formula SiR1R2R3R4, wherein R1 is an ethylenically unsaturated hydrocarbon radical, R2 and R3 are independently selected from substituted or unsubstituted aryl, substituted or unsubstituted aryl substituted hydrocarbon radical, substituted or unsubstituted linear or branched alkoxy radical, substituted or unsubstituted cyclic alkoxy radical, substituted or unsubstituted linear or branched alkyl radical, or substituted or unsubstituted cyclic alkyl radical, and R4 is substituted or unsubstituted linear or branched alkoxy radical, or substituted or unsubstituted cyclic alkoxy radical.

23. The low stress moisture resistant structure of semiconductor device according to claim 20, wherein said repeat units arising from a first olefin having a crosslinkable group is a repeat unit arising from ethylenically unsaturated silane of the formula SiR1R2R3R4, wherein R1 is an ethylenically unsaturated hydrocarbon radical, R2 is aryl, aryl substituted hydrocarbon radical, branched C3-C6 alkoxy radical, or substituted or unsubstituted cyclic C5-C6 alkoxy radical, and R3 and R4 are independently selected from linear or branched C1-C6 alkoxy radical, or substituted or unsubstituted cyclic C5-C6 alkoxy radical.

24. The low stress moisture resistant structure of semiconductor device according to claim 20, wherein said repeat units arising from a first olefin having a crosslinkable group is a repeat unit arising from an ethylenically unsaturated epoxide.

25. The low stress moisture resistant structure of semiconductor device according to claim 20, wherein said repeat units arising from a first olefin having a crosslinkable group is a repeat unit arising from an ethylenically unsaturated epoxide selected from the group consisting of allyl glycidyl ether, glycidyl acrylate and glycidyl methacrylate.

26. The low stress moisture resistant structure of semiconductor device according to claim 20, wherein said fluoroolefin contains from 2 to 6 carbon atoms and at least 60 weight percent fluorine.

27. The low stress moisture resistant structure of semiconductor device according to claim 20, wherein said fluoroolefin contains from 2 to 6 carbon atoms and is perfluorinated.

28. The low stress moisture resistant structure of semiconductor device according to claim 20, wherein said second olefin contains from 2 to 12 carbon atoms, and comprises the elements C, H and optionally at least one heteroatom selected from O, N and S and halogens F, Cl and Br.

29. The low stress moisture resistant structure of semiconductor device according to claim 20, wherein said second olefin is an alkyl vinyl ether wherein the alkyl group is a C1 to C6 straight chain alkyl radical or a C3 to C6 branched chain or cyclic alkyl radical, or aryl vinyl ether wherein the aryl group is unsubstituted or substituted.

30. The low stress moisture resistant structure of semiconductor device according to claim 20, wherein said fluoroolefin is tetrafluoroethylene and the amount of repeat units in said fluoropolymer arising from tetrafluoroethylene is about 40 to about 60 mole percent, wherein said second olefin is ethyl vinyl ether and the amount of repeat units in said fluoropolymer arising from ethyl vinyl ether is about 40 to about 60 mole percent, and wherein said repeat units arising from a first olefin having a crosslinkable group is a repeat unit arising from vinyltriisopropoxysilane, and the amount of repeat units in said fluoropolymer arising from said vinyltriisopropoxysilane is about 0.2 to about 10 mole percent.

31. The low stress moisture resistant structure of semiconductor device according to claim 1, wherein the fluoropolymer of said crosslinked fluoropolymer comprises crosslinkable fluoropolymer having repeat units comprising: (a) fluoroolefin selected from the group consisting of tetrafluoroethylene, chlorotrifluoroethylene, hexafluoropropylene, perfluoro(methyl vinyl ether), perfluoro(ethyl vinyl ether), and perfluoro(propyl vinyl ether); (b) alkyl vinyl ether wherein the alkyl group is a C1 to C6 straight chain alkyl radical or a C3 to C6 branched chain or cyclic alkyl radical, or aryl vinyl ether wherein the aryl group is unsubstituted or substituted; and (c) ethylenically unsaturated silane of the formula SiR1R2R3R4, wherein R1 is an ethylenically unsaturated hydrocarbon radical, R2 is aryl, aryl substituted hydrocarbon radical, branched C3-C6 alkoxy radical, or substituted or unsubstituted cyclic C5-C6 alkoxy radical, and R3 and R4 are independently selected from linear or branched C1-C6 alkoxy radical, or substituted or unsubstituted cyclic C5-C6 alkoxy radical.

32. A low stress moisture resistant structure of semiconductor device,
wherein a semiconductor device is formed on a semiconductor wafer,
wherein said semiconductor wafer has a wafer outer surface,
wherein said semiconductor device comprises at least one pad,
wherein said semiconductor device has a device outer surface,
wherein said device outer surface includes a pad top outer surface of each of said at least one pad and an outside pad top device outer surface,
wherein said pad top outer surface of each of said at least one pad includes a pad top center surface, a pad top first intermediate surface, a pad top second intermediate surface, and a pad top peripheral surface,
wherein said pad top first intermediate surface is located between said pad top center surface and said pad top second intermediate surface,
wherein said pad top second intermediate surface is located between said pad top first intermediate surface and said pad top peripheral surface,
wherein a base covering layer is coated on said wafer outer surface, said outside pad top device outer surface, said pad top second intermediate surface and said pad top peripheral surface of said pad top outer surface of each of said at least one pad,
wherein said base covering layer includes a covering second intermediate part and an outside covering second intermediate part,
wherein said covering second intermediate part covers said pad top second intermediate surface of said pad top outer surface of each of said at least one pad,
wherein said covering second intermediate part of said base covering layer has a covering second intermediate part outer surface,
wherein said outside covering second intermediate part of said base covering layer has an outside covering second intermediate part outer surface,
wherein said low stress moisture resistant structure comprises:
a low stress moisture resistant layer coated on said outside covering second intermediate part outer surface of said outside covering second intermediate part of said base covering layer so that said covering second intermediate part outer surface of said covering second intermediate part of said base covering layer, said pad top first intermediate surface, and said pad top center surface of said pad top outer surface of each of said at least one pad are exposed,
wherein said low stress moisture resistant layer comprises a material comprising crosslinked fluoropolymer,
wherein a before-coated stress measured on said semiconductor wafer before said low stress moisture resistant layer is coated and an after-cured stress measured on said semiconductor wafer after said low stress moisture resistant layer is coated and cured define a stress difference, and
wherein said stress difference is greater than or equal to $-5 \times 10^7$ dyne/cm$^2$, and less than or equal to $5 \times 10^7$ dyne/cm$^2$.

33. The low stress moisture resistant structure of semiconductor device according to claim 32, wherein said low stress moisture resistant layer is coated on said outside covering second intermediate part outer surface of said outside covering second intermediate part of said base covering layer and said covering second intermediate part outer surface of said covering second intermediate part of said base covering layer so that said pad top first intermediate surface and said pad top center surface of said pad top outer surface of each of said at least one pad are exposed.

34. The low stress moisture resistant structure of semiconductor device according to claim 33, wherein said low stress moisture resistant layer is coated on said outside covering second intermediate part outer surface of said outside covering second intermediate part of said base covering layer, said covering second intermediate part outer surface of said covering second intermediate part of said base covering layer, and said pad top first intermediate surface of said pad top outer surface of each of said at least one pad so that said pad top center surface of said pad top outer surface of each of said at least one pad is exposed.

35. The low stress moisture resistant structure of semiconductor device according to claim 32, wherein said low stress moisture resistant layer is photodefined.

36. The low stress moisture resistant structure of semiconductor device according to claim 35, wherein said low stress moisture resistant layer is patterned by a photolithography process.

37. The low stress moisture resistant structure of semiconductor device according to claim 32, wherein said low stress moisture resistant layer is cured at greater than or equal to 170° C. and less than or equal to 250° C.

38. The low stress moisture resistant structure of semiconductor device according to claim 32, wherein said semiconductor wafer is made of Silicon or Diamond.

39. The low stress moisture resistant structure of semiconductor device according to claim 32, wherein said semiconductor wafer is a compound semiconductor wafer.

40. The low stress moisture resistant structure of semiconductor device according to claim 39, wherein said semiconductor wafer is made of one material selected from the group consisting of: GaAs, sapphire, InP, SiC, SOI and GaN.

41. The low stress moisture resistant structure of semiconductor device according to claim 32, wherein a thickness of said low stress moisture resistant layer is greater than or equal to 0.5 µm, and said thickness of said low stress moisture resistant layer is less than or equal to 30 µm.

42. The low stress moisture resistant structure of semiconductor device according to claim 41, wherein said thickness of said low stress moisture resistant layer is greater than or equal to 0.5 µm, and said thickness of said low stress moisture resistant layer is less than or equal to 10 µm.

43. The low stress moisture resistant structure of semiconductor device according to claim 32, wherein said base covering layer is made of at least one material selected from the group consisting of: silicon nitride, silicon oxide, aluminum nitride and aluminum oxide.

44. The low stress moisture resistant structure of semiconductor device according to claim 32, wherein a thickness of said base covering layer is greater than or equal to 0.01 µm, and said thickness of said base covering layer is less than or equal to 10 µm.

45. The low stress moisture resistant structure of semiconductor device according to claim 44, wherein said thickness of said base covering layer is greater than or equal to 0.01 µm, and said thickness of said base covering layer is less than or equal to 2 µm.

46. The low stress moisture resistant structure of semiconductor device according to claim 32, wherein said semiconductor device comprises an epitaxial structure, wherein said device outer surface includes an epitaxial structure outer surface of said epitaxial structure.

47. The low stress moisture resistant structure of semiconductor device according to claim 32, wherein a dielectric constant of said low stress moisture resistant layer is greater than or equal to 2.0, and less than or equal to 2.9 when measured at 1 MHz.

48. The low stress moisture resistant structure of semiconductor device according to claim 32, wherein the fluoropolymer of said crosslinked fluoropolymer comprises crosslinkable fluoropolymer having crosslinkable groups.

49. The low stress moisture resistant structure of semiconductor device according to claim 48, wherein the fluoropolymer of said crosslinked fluoropolymer comprises crosslinkable fluoropolymer comprising repeat units arising from a first olefin having a crosslinkable group and repeat units arising from a fluoroolefin.

50. The low stress moisture resistant structure of semiconductor device according to claim 49, wherein said repeat units arising from a first olefin having a crosslinkable group is a repeat unit arising from ethylenically unsaturated silane of the formula SiR1R2R3R4, wherein R1 is an ethylenically unsaturated hydrocarbon radical, R2 and R3 are independently selected from substituted or unsubstituted aryl, substituted or unsubstituted aryl substituted hydrocarbon radical, substituted or unsubstituted linear or branched alkoxy radical, substituted or unsubstituted cyclic alkoxy radical, substituted or unsubstituted linear or branched alkyl radical, or substituted or unsubstituted cyclic alkyl radical, and R4 is substituted or unsubstituted linear or branched alkoxy radical, or substituted or unsubstituted cyclic alkoxy radical.

51. The low stress moisture resistant structure of semiconductor device according to claim 49, wherein said repeat units arising from first olefin having a crosslinkable group is a repeat unit arising from ethylenically unsaturated silane of the formula SiR1R2R3R4, wherein R1 is an ethylenically unsaturated hydrocarbon radical, R2 is aryl, aryl substituted hydrocarbon radical, branched C3-C6 alkoxy radical, or substituted or unsubstituted cyclic C5-C6 alkoxy radical, and R3 and R4 are independently selected from linear or branched C1-C6 alkoxy radical, or substituted or unsubstituted cyclic C5-C6 alkoxy radical.

52. The low stress moisture resistant structure of semiconductor device according to claim 49, wherein said repeat units arising from a first olefin having a crosslinkable group is a repeat unit arising from an ethylenically unsaturated epoxide.

53. The low stress moisture resistant structure of semiconductor device according to claim 49, wherein said repeat units arising from a first olefin having a crosslinkable group is a repeat unit arising from an ethylenically unsaturated epoxide selected from the group consisting of allyl glycidyl ether, glycidyl acrylate and glycidyl methacrylate.

54. The low stress moisture resistant structure of semiconductor device according to claim 49, wherein said fluoroolefin contains from 2 to 6 carbon atoms and at least 60 weight percent fluorine.

55. The low stress moisture resistant structure of semiconductor device according to claim 49, wherein said fluoroolefin contains from 2 to 6 carbon atoms and is perfluorinated.

56. The low stress moisture resistant structure of semiconductor device according to claim 32, wherein the fluoropolymer of said crosslinked fluoropolymer comprises crosslinkable fluoropolymer comprising repeat units arising from a first olefin having a crosslinkable group, repeat units arising from a fluoroolefin, and repeat units arising from a second olefin.

57. The low stress moisture resistant structure of semiconductor device according to claim 56, wherein the amount of repeat units in said fluoropolymer arising from said fluoroolefin is about 40 to about 60 mole percent, wherein the amount of repeat units in said fluoropolymer arising from said second olefin is about 40 to about 60 mole percent, and wherein the amount of repeat units in said fluoropolymer arising from said first olefin having a crosslinkable group is about 0.2 to about 10 mole percent.

58. The low stress moisture resistant structure of semiconductor device according to claim 56, wherein said repeat units arising from a first olefin having a crosslinkable group is a repeat unit arising from ethylenically unsaturated silane of the formula SiR1R2R3R4, wherein R1 is an ethylenically unsaturated hydrocarbon radical, R2 and R3 are independently selected from substituted or unsubstituted aryl, substituted or unsubstituted aryl substituted hydrocarbon radical, substituted or unsubstituted linear or branched alkoxy radical, substituted or unsubstituted cyclic alkoxy radical, substituted or unsubstituted linear or branched alkyl radical, or substituted or unsubstituted cyclic alkyl radical, and R4 is substituted or unsubstituted linear or branched alkoxy radical, or substituted or unsubstituted cyclic alkoxy radical.

59. The low stress moisture resistant structure of semiconductor device according to claim 56, wherein said repeat units arising from a first olefin having a crosslinkable group is a repeat unit arising from ethylenically unsaturated silane of the formula SiR1R2R3R4, wherein R1 is an ethylenically unsaturated hydrocarbon radical, R2 is aryl, aryl substituted hydrocarbon radical, branched C3-C6 alkoxy radical, or substituted or unsubstituted cyclic C5-C6 alkoxy radical, and R3 and R4 are independently selected from linear or branched C1-C6 alkoxy radical, or substituted or unsubstituted cyclic C5-C6 alkoxy radical.

60. The low stress moisture resistant structure of semiconductor device according to claim 56, wherein said repeat units arising from a first olefin having a crosslinkable group is a repeat unit arising from an ethylenically unsaturated epoxide.

61. The low stress moisture resistant structure of semiconductor device according to claim 56, wherein said repeat units arising from a first olefin having a crosslinkable group is a repeat unit arising from an ethylenically unsaturated epoxide selected from the group consisting of allyl glycidyl ether, glycidyl acrylate and glycidyl methacrylate.

62. The low stress moisture resistant structure of semiconductor device according to claim 56, wherein said fluoroolefin contains from 2 to 6 carbon atoms and at least 60 weight percent fluorine.

63. The low stress moisture resistant structure of semiconductor device according to claim 56, wherein said fluoroolefin contains from 2 to 6 carbon atoms and is perfluorinated.

64. The low stress moisture resistant structure of semiconductor device according to claim 56, wherein said second olefin contains from 2 to 12 carbon atoms, and comprises the elements C, H and optionally at least one heteroatom selected from O, N and S and halogens F, Cl and Br.

65. The low stress moisture resistant structure of semiconductor device according to claim 56, wherein said second olefin is an alkyl vinyl ether wherein the alkyl group is a C1 to C6 straight chain alkyl radical or a C3 to C6 branched chain or cyclic alkyl radical, or aryl vinyl ether wherein the aryl group is unsubstituted or substituted.

66. The low stress moisture resistant structure of semiconductor device according to claim 56, wherein said fluoroolefin is tetrafluoroethylene and the amount of repeat units in said fluoropolymer arising from tetrafluoroethylene is about 40 to about 60 mole percent, wherein said second olefin is ethyl vinyl ether and the amount of repeat units in said fluoropolymer arising from ethyl vinyl ether is about 40 to about 60 mole percent, and wherein said repeat units arising from a first olefin having a crosslinkable group is a repeat unit arising from vinyltriisopropoxysilane, and the amount of repeat units in said fluoropolymer arising from said vinyltriisopropoxysilane is about 0.2 to about 10 mole percent.

67. The low stress moisture resistant structure of semiconductor device according to claim 32, wherein the fluoropolymer of said crosslinked fluoropolymer comprises crosslinkable fluoropolymer having repeat units comprising: (a) fluoroolefin selected from the group consisting of tetrafluoroethylene, chlorotrifluoroethylene, hexafluoropropylene, perfluoro(methyl vinyl ether), perfluoro(ethyl vinyl ether), and perfluoro(propyl vinyl ether): (b) alkyl vinyl ether wherein the alkyl group is a C1 to C6 straight chain alkyl radical or a C3 to C6 branched chain or cyclic alkyl radical, or aryl vinyl ether wherein the aryl group is unsubstituted or substituted; and (c) ethylenically unsaturated silane of the formula SiR1R2R3R4, wherein R1 is an ethylenically unsaturated hydrocarbon radical, R2 is aryl, aryl substituted hydrocarbon radical, branched C3-C6 alkoxy radical, or substituted or unsubstituted cyclic C5-C6 alkoxy radical, and R3 and R4 are independently selected from linear or branched C1-C6 alkoxy radical, or substituted or unsubstituted cyclic C5-C6 alkoxy radical.

\* \* \* \* \*